United States Patent
Shigehisa et al.

(10) Patent No.: US 10,341,213 B2
(45) Date of Patent: Jul. 2, 2019

(54) RECEPTION DEVICE AND CLOCK GENERATING METHOD

(71) Applicant: Renesas Electronics Corporation, Tokyo (JP)

(72) Inventors: Hirofumi Shigehisa, Tokyo (JP); Teruhisa Takeda, Tokyo (JP); Akihito Sakai, Tokyo (JP); Hirohisa Furukawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/841,756

(22) Filed: Dec. 14, 2017

(65) Prior Publication Data

US 2018/0212856 A1    Jul. 26, 2018

(30) Foreign Application Priority Data

Jan. 25, 2017    (JP) .................................. 2017-011240

(51) Int. Cl.
| | |
|---|---|
| G04G 13/02 | (2006.01) |
| G07C 5/04 | (2006.01) |
| H04L 12/26 | (2006.01) |
| H03K 3/01 | (2006.01) |
| H03M 1/66 | (2006.01) |
| H04N 21/43 | (2011.01) |

(52) U.S. Cl.
CPC ............. H04L 43/106 (2013.01); H03K 3/01 (2013.01); H03M 1/66 (2013.01); H04N 21/4305 (2013.01); H04N 21/4307 (2013.01)

(58) Field of Classification Search
CPC ...................................................... H04L 43/106
See application file for complete search history.

(56) References Cited

U.S. PATENT DOCUMENTS

| | | | | |
|---|---|---|---|---|
| 4,543,657 A | * | 9/1985 | Wilkinson | ............. G04R 20/22 368/47 |
| 5,157,727 A | * | 10/1992 | Schloss | ................... G10L 15/02 704/213 |

(Continued)

FOREIGN PATENT DOCUMENTS

JP    11-313107 A    11/1999

*Primary Examiner* — Joseph H Feild
*Assistant Examiner* — Pameshanand Mahase
(74) *Attorney, Agent, or Firm* — McDermott Will & Emery LLP

(57) ABSTRACT

An object of the present invention is to generate a clock also before reception of a packet in a reception device. A reception device has: a storage unit storing a true time-stamp included in a received packet including audio data and the true time-stamp expressing reproduction time of the audio data; a timer counting time; a dummy time-stamp generation unit generating a dummy time-stamp as a false time-stamp; a comparator comparing time based on the true time-stamp stored in the storage unit or the dummy time-stamp and time indicated by the timer; and a clock generation unit generating a clock in accordance with a comparison result of the comparator. The comparator performs comparison using the dummy time-stamp until a predetermined condition is satisfied and, after the predetermined condition is satisfied, performs comparison using the true time-stamp.

11 Claims, 14 Drawing Sheets

(56) References Cited

U.S. PATENT DOCUMENTS

| | | | |
|---|---|---|---|
| 6,381,660 B1 * | 4/2002 | Ito .................. | H04J 3/0664 |
| | | | 369/47.1 |
| 2015/0009795 A1 * | 1/2015 | Gray ................ | H04W 24/08 |
| | | | 370/210 |

* cited by examiner

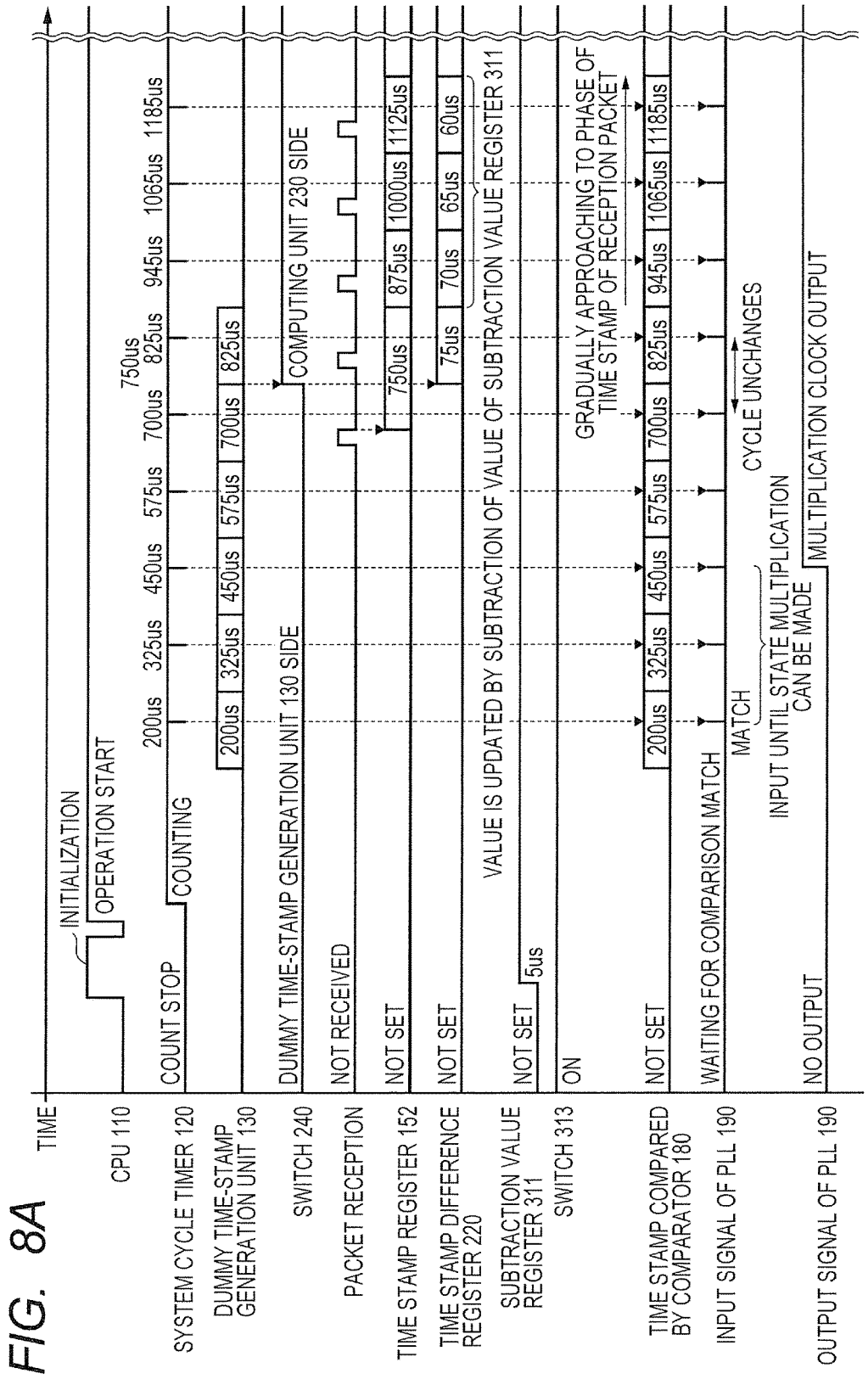

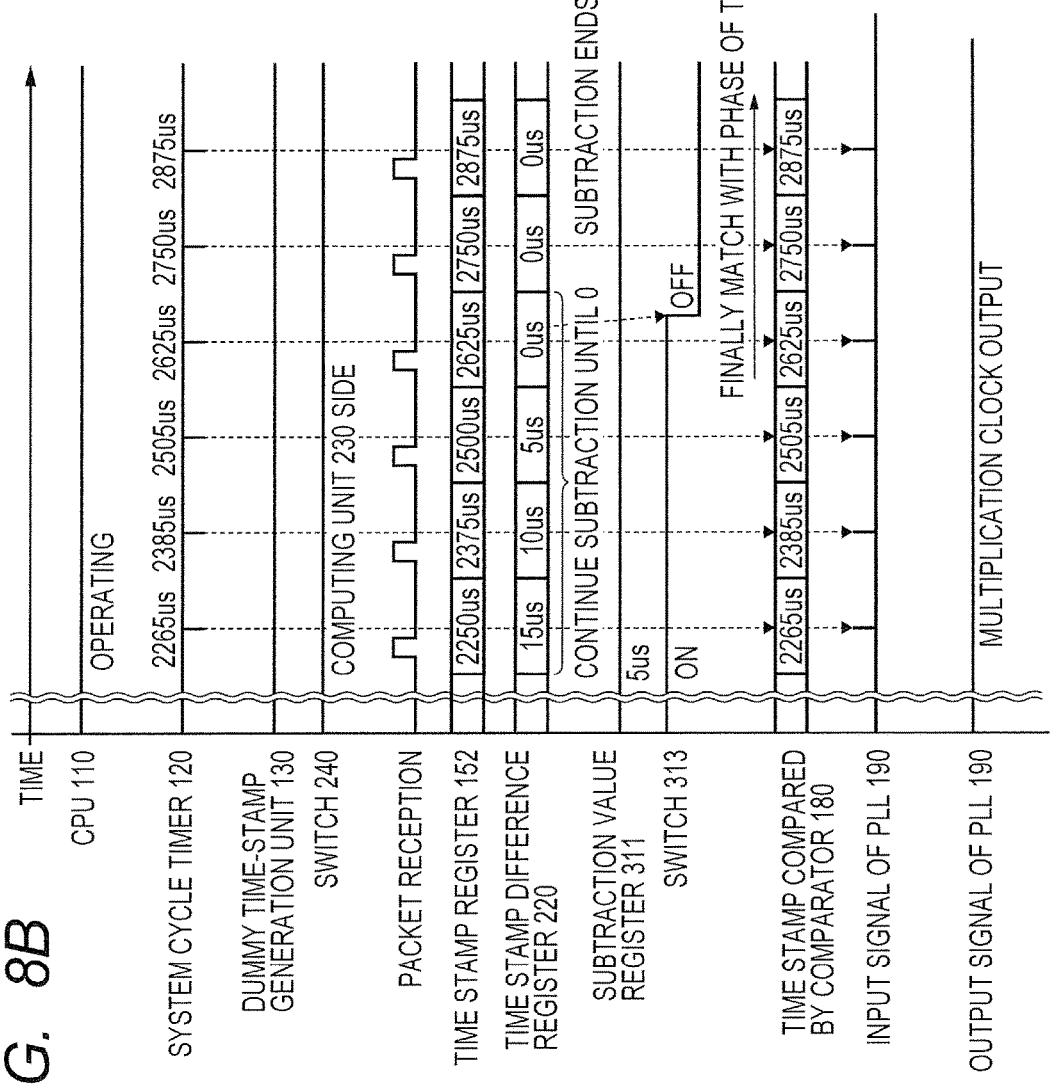

RECEPTION DEVICE AND CLOCK GENERATING METHOD

CROSS-REFERENCE TO RELATED APPLICATIONS

The disclosure of Japanese Patent Application No. 2017-011240 filed on Jan. 25, 2017 including the specification, drawings and abstract is incorporated herein by reference in its entirety.

BACKGROUND

The present invention relates to a reception device and a clock generating method.

Digital communication performing packet communication by adding a time stamp as a system time (that is, time information) to audio data is known.

For example, patent literature 1 discloses generation of clocks in a reception device receiving a packet including system time and audio data. The reception device generates a pulse when time of a system timer in the reception device and time of a time stamp included in a received packet match. The reception device generates a clock by using the pulse and a PLL (Phase Locked Loop). The received audio data is reproduced synchronously with the clock.

The reception device described in the patent literature 1 generates a clock even in the case where a drop occurs in reception of packets by adding a differential value of time stamps to a received time stamp.

RELATED ART LITERATURE

Patent Literature

Patent Literature 1: Japanese Unexamined Patent Application Publication No. Hei 11(1999)-313107

SUMMARY

In the technique described in the patent literature 1, however, to generate a clock, a time stamp included in a packet is necessary. Therefore, it has a problem such that a clock cannot be generated before reception of a packet.

The other problems and novel features will become apparent from the description of the specification and appended drawings.

According to an embodiment, a reception device has a dummy time-stamp generation unit generating a dummy time-stamp, a comparator comparing time based on a true time-stamp included in a packet or the dummy time-stamp with time indicated by a timer, and a clock generation unit generating a clock in accordance with a comparison result of the comparator, and the comparator performs comparison using the dummy time-stamp until a predetermined condition is satisfied.

According to the embodiment, a clock can be generated also before reception of a packet in the reception device.

BRIEF DESCRIPTION OF THE DRAWINGS

FIG. 8A is a timing chart illustrating an example of operations of the reception device according to the third embodiment.

FIG. 8B is a timing chart illustrating an example of operations of the reception device according to the third embodiment.

DETAILED DESCRIPTION

Figure 1:
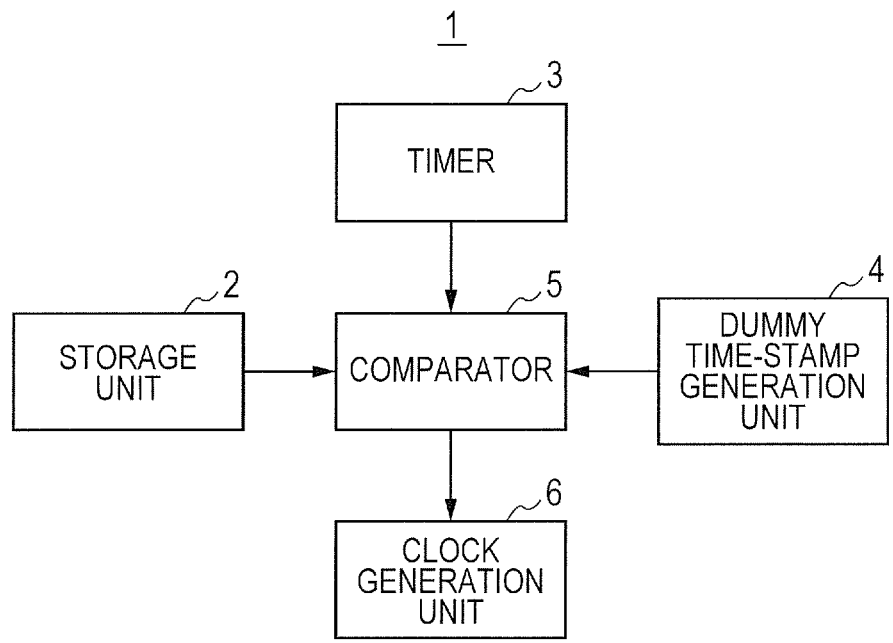
FIG. 1 is a block diagram illustrating an example of the configuration of a reception device according to outline of an embodiment.

To make description clear, omission and simplification is properly made in the following description and the drawings. In the drawings, the same reference numerals are designated to the same element and repetitive description is not made as necessary.

Outline of Embodiments

Prior to description of details of embodiments, first, outline of embodiments will be described. FIG. 1 is a block diagram illustrating an example of the configuration of a reception device 1 according to outline of an embodiment. As illustrated in FIG. 1, the reception device 1 has a storage unit 2, a timer 3, a dummy time-stamp generation unit 4, a comparator 5, and a clock generation unit 6.

The reception device 1 is a device for receiving a packet transmitted from a transmission device (not illustrated) via a wired or wireless network. The packet includes audio data and a time stamp. Hereinafter, the time stamp included in the packet is called a true time-stamp. The true time-stamp is time information expressing reproduction time of audio data included in the same packet as the true time-stamp. The true time-stamp is added to the packet by the transmission device.

The storage unit 2 stores the true time-stamp included in the received packet. The timer 3 counts time. The timer 3 is a timer provided for the transmission device and synchronized with a timer used to giving the true time-stamp. The dummy time-stamp generation unit 4 generates a dummy time-stamp as a false time-stamp. The comparator 5 compares whether time based on a true time-stamp stored in the storage unit 2 or the dummy time-stamp generated by the dummy time-stamp generation unit 4 and time indicated by the timer 3 match or not. The clock generation unit 6 generates a clock in accordance with the comparison result of the comparator 5. The clock generation unit 6 supplies the generated clock to, for example, a process circuit processing audio data. An example of such a process circuit is a DAC (Digital-to-Analog Converter).

The comparator 5 performs comparison using the dummy time-stamp generated by the dummy time-stamp generation unit 4 until a predetermined condition is satisfied and, after the predetermined condition is satisfied, performs comparison using the true time-stamp stored in the storage unit 2. The predetermined condition is more concretely a predetermined condition under which clock generation using the true time-stamp can be performed.

Therefore, the reception device 1 generates a clock in accordance with the result of comparison between the time of the dummy time-stamp and the time indicated by the timer 3 until the predetermined condition is satisfied and, after the predetermined condition is satisfied, generates a clock in accordance with the result of comparison between the time based on the true time-stamp included in the received packet and the time indicated by the timer 3. Consequently, the reception device 1 can generate a clock before a packet is received. Therefore, the reception device 1 can generate, for example, a clock for setting a DAC or the like on the basis of the dummy time-stamp and generate a clock for processing audio data by a DAC or the like on the basis of a true time-stamp.

First Embodiment

Figure 2:
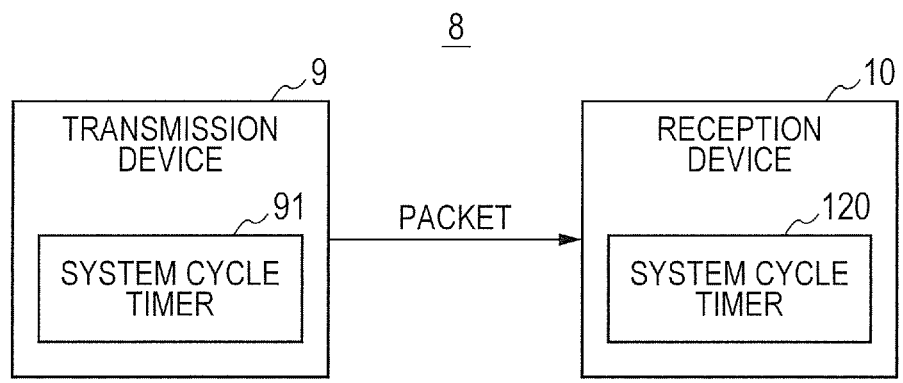
FIG. 2 is a block diagram illustrating a configuration example of a transmission/reception system according to a first embodiment.

The details of the embodiments will now be described. FIG. 2 is a block diagram illustrating a configuration example of a transmission/reception system 8 according to a first embodiment. As illustrated in FIG. 2, the transmission/reception system 8 has a reception device 10 and a transmission device 9.

The reception device 10 is a device corresponding to the reception device 1 in FIG. 1 and receiving a packet transmitted from the transmission device 9 via a wired network. Alternatively, a wireless network may be used. The transmission device 9 sequentially transmits a packet including audio data and a true time-stamp to the reception device 10 at predetermined transfer time intervals. The transfer time interval is determined by the sampling frequency of the audio data and the number of samples of the audio data per packet. For example, when transferring six samples per packet of audio data at a sampling frequency of 48 kHz (that is, the number of samples per second is 48,000), the packet transfer time interval is 8 kHz (=48 kHz/6).

The transmission device 9 has a system cycle timer 91 synchronized with a system cycle timer 120 provided for the reception device 10. Consequently, the transmission device 9 and the reception device 10 perform, for example, time synchronizing process of synchronizing times of the system cycle timers by periodically notifying times of each other. The transmission device 9 adds one true time-stamp expressing reproduction time of audio data to be transmitted to a packet at the time of transmitting the packet. At the time of transmitting the packet, the transmission device 9 punches, as a true time-stamp, time obtained by adding predetermined margin time to transmission time specified by the system cycle timer 91. The predetermined margin time is maximum time required since the transmission device 9 transmits a packet until the reception device 10 receives it. That is, as the margin time, time in which the reception device 10 can certainly receive a packet is set. The reception device 10 controls a timing of outputting the audio data included in a received packet to an external device such as a DAC by comparing the time of the true time-stamp of the received packet with the system cycle timer 120. By the operation, the audio data is reproduced at the time of the true time-stamp.

Figure 3:
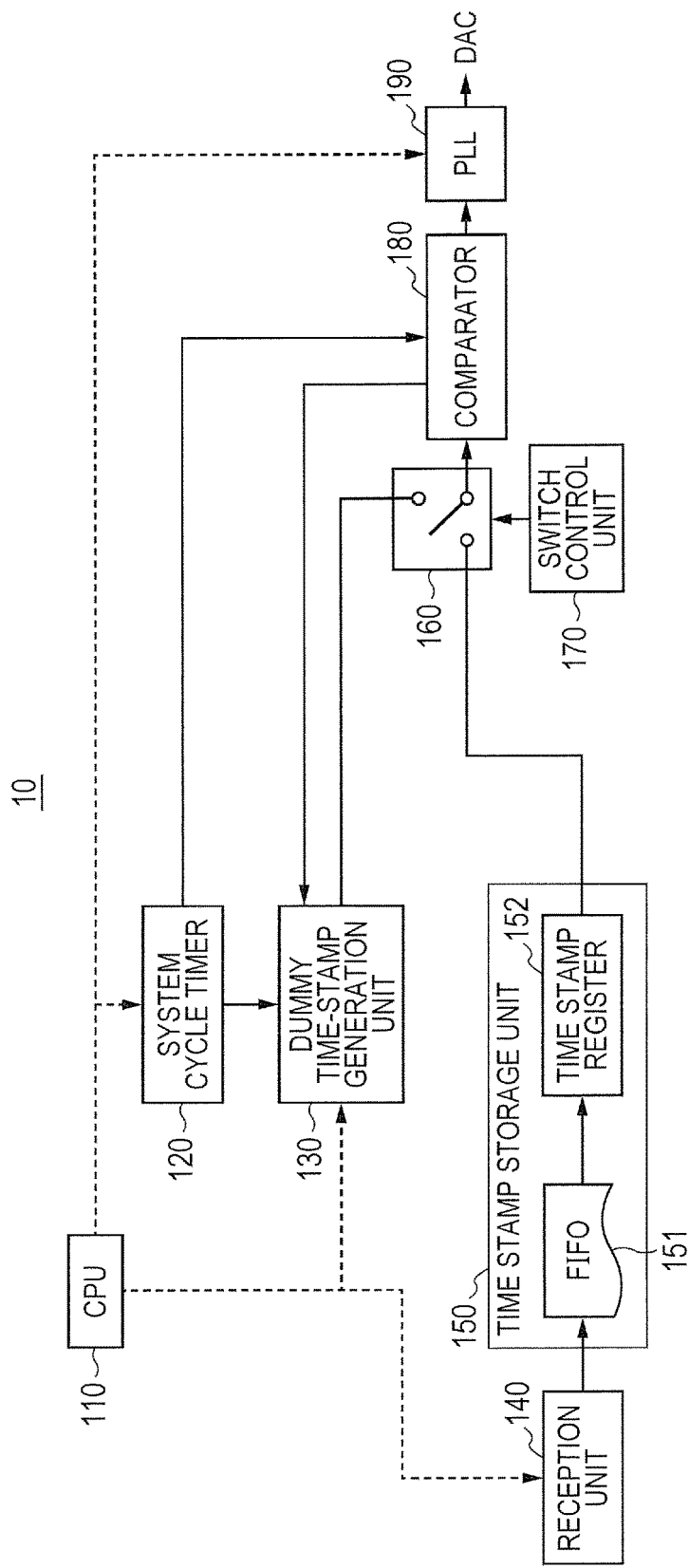
FIG. 3 is a block diagram illustrating a configuration example of a reception device according to the first embodiment.

Next, the details of the reception device 10 will be described. FIG. 3 is a block diagram illustrating a configuration example of the reception device 10 according to the first embodiment. As illustrated in FIG. 3, the reception device 10 has a CPU 110, the system cycle timer 120, a dummy time-stamp generation unit 130, a reception unit 140, a time stamp storage unit 150, a switch 160, a switch control unit 170, a comparator 180, and a PLL 190. In FIG. 3 and FIGS. 5, 7, 9, 10, 12, 13, and 14 which will be described later, broken-line arrows indicate controls performed by the CPU 110 and solid-line arrows indicate controls performed by hardware.

The CPU (Central Processing Unit) 110 executes a program stored in a memory (not illustrated) provided for the reception device 10 and controls the reception device 10. Particularly, in the embodiment, the CPU 110 executes initial setting and operation start instruction.

The above-described program is stored by using any of non-transitory computer readable media of various types and can be supplied to a computer. The non-transitory computer readable media include tangible storage media of various types. Examples of the non-transitory computer readable media include magnetic recording media (for example, flexible disk, magnetic tape, and hard disk drive), magnet-optic recording media (for example, magnet-optic disk), CD-ROM (Read Only Memory), CD-R, CD-R/W, and semiconductor memories (for example, mask ROM, PROM (Programmable ROM), EPROM (Erasable PROM), flash ROM, and RAM (Random Access Memory)). The program may be supplied to a computer by any of transitory computer readable media of various types. Examples of the transitory computer readable media include an electric signal, an optical signal, and an electromagnetic wave. The transitory computer readable medium can supply a program to a computer via a wired communication path such as an electric wire or an optical fiber or a wireless communication path.

The CPU 110 makes, as initial settings, a setting of dummy cycle time to the dummy time-stamp generating unit 130 and a setting of multiplication rate to the PLL 190. The dummy cycle time is time interval of dummy time-stamps. Concretely, the CPU 110 sets time corresponding to the transfer time interval of packets from the transmission device 9 to the reception device 10 as the dummy cycle time. For example, when transferring six samples per packet of audio data whose sampling frequency is 48 kHz, as described above, the packet transfer time interval is 8 kHz. Consequently, the CPU 110 sets time corresponding to the interval of 8 kHz, that is, 125 μs (microseconds) as the dummy cycle time. As the initial setting, the CPU 110 sets the multiplication rate so that the PLL 190 outputs a clock of a predetermined frequency determined according to the sampling frequency and the number of samples per frame. In the case of transferring six samples per packet of audio data whose sampling frequency is 48 kHz, for example, the CPU 110 sets the multiplication rate so that the PLL 190 outputs the clock of the frequency of 24.576 MHz. At the time of the initial setting, information such as the sampling cycle of audio data and the number of samples per packet is known in the reception device 10.

When the initial setting is completed, the CPU 110 instructs the system cycle timer 120 to start operation as an operation start instruction. When a handshake for transmitting/receiving a packet is completed, the CPU 110 permits receiving operation of the reception unit 140.

The system cycle timer 120 corresponds to the timer 3 in FIG. 1 and is a circuit counting time in the reception device 10.

The dummy time-stamp generation unit 130 corresponds to the dummy time-stamp generation unit 4 in FIG. 1 and is a circuit for generating a dummy time-stamp. When time synchronizing process of the system cycle timer 120 is completed, the dummy time-stamp generation unit 130 captures time from the system cycle timer 120. The dummy time-stamp generation unit 130 generates time by adding dummy cycle time to the captured time as a first dummy time-stamp. After that, each time the comparator 180 outputs a match signal, the dummy time-stamp generation unit 130 generates a new dummy time-stamp having time obtained by adding the dummy cycle time to the dummy time-stamp of the previous time.

The reception unit 140 is an interface circuit receiving a packet transmitted from the transmission device 9. The reception unit 140 outputs a true time-stamp included in the received packet to the time stamp storage unit 150.

The time stamp storage unit 150 corresponds to the storage unit 2 in FIG. 1 and has an FIFO 151 and a time stamp register 152.

The FIFO 151 is a buffer of an FIFO (First In First Out) type holding a true time-stamp. The time stamp register 152 is a register holding one true time-stamp. The time stamp held in the time stamp register 152 is output to the comparator 180 every comparing operation by the comparator 180. When the time stamp held in the time stamp register 152 is output to the comparator, one time stamp is output from the FIFO 151 to the time stamp register 152. Although the controls in the time stamp storage unit 150 are performed by, for example, a control unit (not illustrated) in the time stamp storage unit 150, they may be performed by control of the CPU 110.

The switch 160 is a switch selecting a time stamp supplied to the comparator 180 and is controlled by the switch control unit 170. Concretely, as a time stamp supplied to the comparator 180, the switch 160 selects either the dummy time-stamp output from the dummy time-stamp generation unit 130 or the true time-stamp output from the time stamp register 152.

The switch control unit 170 is a control circuit controlling the switch 160. The switch control unit 170 controls so as to supply a dummy time-stamp to the comparator 180 until a predetermined condition is satisfied and, after the predetermined condition is satisfied, to supply a true time-stamp to the comparator 180. Concretely, the switch control unit 170 controls the switch 160 so as to supply a dummy time-stamp generated by the dummy time-stamp generation unit 130 to the comparator 180 until the difference between the time of the time stamp output from the dummy time-stamp generation unit 130 and the time of the true time-stamp included in a packet received first by the reception unit 140 becomes less than the dummy cycle time (that is, the transfer time interval). When the difference becomes less than the dummy cycle time, the switch control unit 170 controls the switch 160 so as to supply the true time-stamp output from the time stamp register 152 to the comparator 180. Therefore, the switch 160 selects the dummy time-stamp output from the dummy time-stamp generation unit 130 as a time stamp supplied to the comparator 180 in the initial state. The switch 160 continues the state at least until the reception unit 140 stars receiving a packet.

The comparator 180 corresponds to the comparator 5 in FIG. 1 and is a comparison circuit comparing the time of the dummy time-stamp or the true time-stamp and the time indicated by the system cycle timer 120. Since the switch 160 is controlled as described above, the comparator 180 compares the time of the dummy time-stamp and the time of the system cycle timer 120 until the difference between the dummy time-stamp and the time of the first true time-stamp becomes less than the dummy cycle time. When the difference becomes less than the dummy cycle time, the comparator 180 compares the time of the true time-stamp and the time of the system cycle timer 120. Each time the time of the time stamp and time of the system cycle timer 120 match, the comparator 180 outputs a match signal to the PLL 190 and the dummy time-stamp generation unit 130.

The PLL 190 corresponds to the clock generation unit 6 in FIG. 1, and generates a clock in accordance with the comparison result of the comparator 180. Concretely, the PLL 190 is a PLL circuit using a match signal output from the comparator 180 as an input signal and generating a clock signal obtained by multiplying the input signal. The PLL 190 supplies the generated clock signal to an external device including a DAC. The DAC is a converter performing digital-to-analog conversion on audio data included in a packet received by the reception device 10. When audio data included in a packet is converted to an analog signal by the DAC, the audio data is reproduced.

Figure 4:
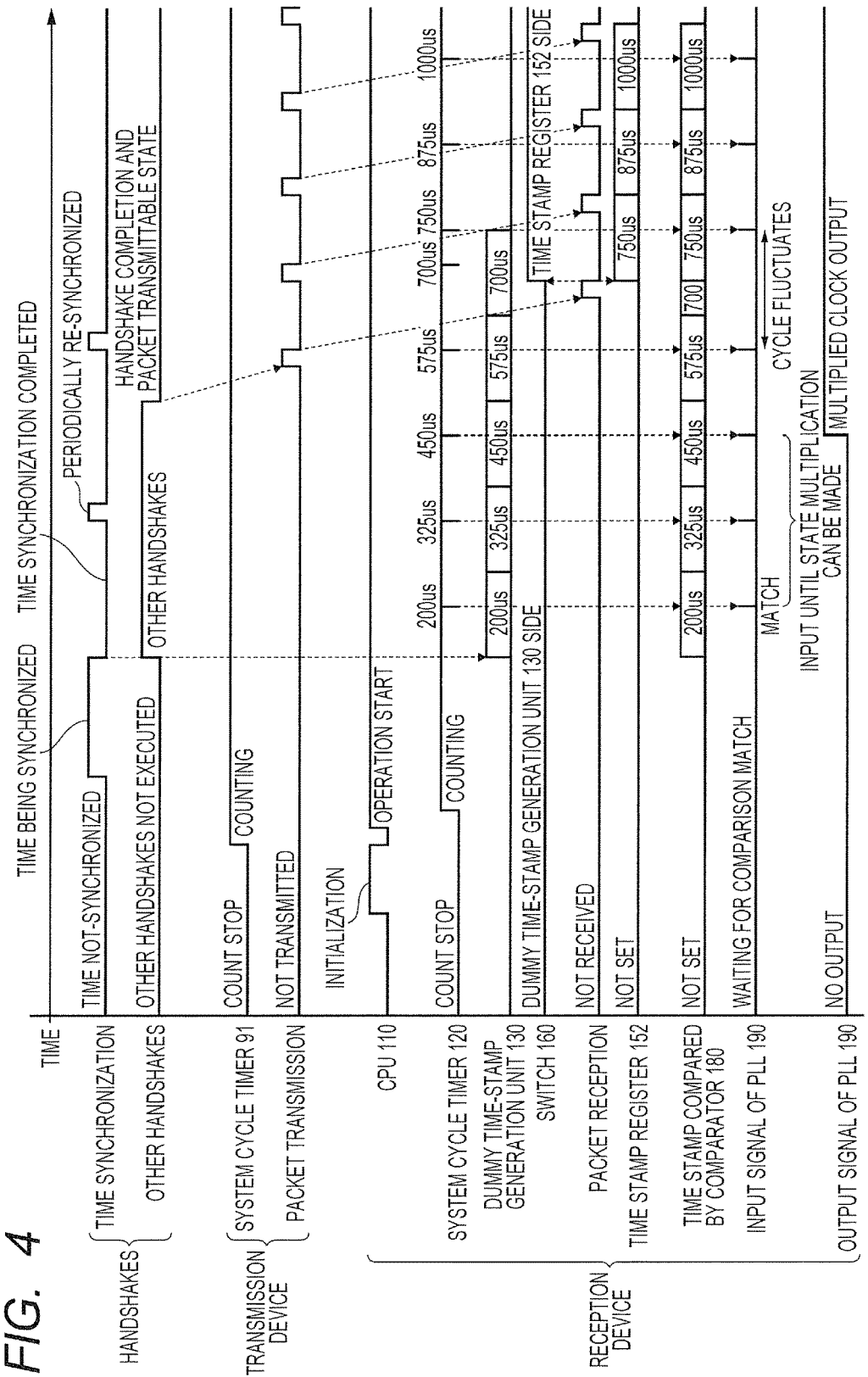
FIG. 4 is a timing chart illustrating an example of operations of the transmission/reception system according to the first embodiment.

Next, an operation example of the transmission/reception system 8 according to the first embodiment will be described. FIG. 4 is a timing chart illustrating an example of operations of the transmission/reception system 8. In FIG. 4 and FIGS. 6, 8A and 8B which will be described later, to facilitate understanding of the relations of timings, related timings are indicated by broken-line arrows. Hereinafter, referring to FIG. 4, the operation of the transmission/reception system 8 will be described.

As illustrated in FIG. 4, in the transmission/reception system 8, to transmit/receive a packet, predetermined handshake processes are performed. Concretely, a time synchronizing process is performed as one of the handshake processes and, after that, other remaining handshakes such as assurance of a transmission band are performed. The time synchronizing process is periodically performed also after completion of the synchronization. When the series of handshake processes are completed, the transmission/reception system 8 becomes a packet transmittable/receivable state.

Prior to execution of the handshake processes, the CPU 110 of the reception device 10 executes the above-described initial setting. Specifically, the CPU 110 sets dummy cycle time to the dummy time-stamp generation unit 130 and sets the multiplication rate to the PLL 190. When the initial setting is completed, the CPU 110 instructs the system cycle timer 120 to start operation. By the instruction, the system cycle timer 120 starts counting time. After that, the time synchronizing process as one of the handshake processes is performed. By the time the time synchronizing process is performed, the system cycle timer 91 in the transmission device 9 also starts counting time. When the series of handshake processes are completed, the transmission device 9 starts periodical packet transmission. When the series of handshake processes are completed, the CPU 110 of the reception device 10 permits the receiving operation of the reception unit 140.

Hereinafter, an operation example of the reception device 10 will be described in detail with reference to FIG. 4.

On receipt of the operation instruction by the CPU 110, the system cycle timer 120 starts counting time.

When synchronization of the system cycle timer 120 is completed, the dummy time-stamp generation unit 130 starts generation of a dummy time-stamp. In the example illustrated in FIG. 4, in the initial setting, 125 µs is set as dummy cycle time, and the dummy time-stamp generation unit 130 generates a time stamp of the time interval. Concretely, in the example illustrated in FIG. 4, the dummy time-stamp generation unit 130 captures time 75 µs first and adds the dummy cycle time (125 µs) to the captured time to generate a first dummy time-stamp (200 µs). After that, each time the comparator 180 outputs a match signal, the dummy time-stamp generation unit 130 generates a new dummy time-stamp having time obtained by adding the dummy cycle time (125 µs) to the time stamp of the previous time.

The first packet transmitted from the transmission device 9 reaches the reception device 10 after generation of a dummy time-stamp by the dummy time-stamp generation unit 130 starts in the reception device 10. Hereinafter, the reception unit 140 in the reception device 10 periodically receives packets. In the example illustrated in FIG. 4, the reception unit 140 receives a packet every 125 µs.

When reception of packets by the reception unit 140 starts, a true time-stamp is stored in the time stamp storage unit 150. In the example illustrated in FIG. 4, the time of the true time-stamp added to the packet received first is 750 µs. Consequently, first, the time stamp indicating 750 µs is held in the time stamp register 152. Hereinafter, true time-stamps added to packets sequentially received by the reception unit 140 are sequentially held in the time stamp register 152. Concretely, as illustrated in FIG. 4, in the time stamp register 152, next to the time stamp of 750 µs, the time stamp of 875 µs is held. After that, the time stamp of 1000 µs is held.

In the initial state, the switch 160 is coupled to the dummy time-stamp generation unit 130 side. Therefore, the time stamp compared by the comparator 180 is a dummy time-stamp output from the dummy time-stamp generation unit 130. Therefore, when the dummy time-stamp generation unit 130 starts generating a dummy time-stamp, the comparator 180 compares the generated dummy time-stamp and the time of the system cycle timer 120. Concretely, as illustrated in FIG. 4, the comparator 180 sequentially compares 200 µs, 325 µs, 450 µs, and 575 µs as times indicated by the dummy time-stamps generated by the dummy time-stamp generation unit 130 with the time of the system cycle timer 120.

When the difference between the time stamp output from the dummy time-stamp generation unit 130 and the time of the true time-stamp (750 µs in the example of FIG. 4) included in the packet received first by the reception unit 140 becomes less than the dummy cycle time (125 µs in the example illustrated in FIG. 4), the switch 160 is switched so as to be coupled to the time stamp register 152 side. When the dummy time-stamp generation unit 130 outputs a dummy time-stamp of 700 µs, the difference with the time of the first true time-stamp becomes less than the dummy cycle time, so that the switch 160 is switched. Since the switching timing of the switch 160 is the timing as described above, not the time of the packet reception start, it is suppressed that comparison is not performed for long time after completion of the comparison using the dummy time-stamp. That is, it is suppressed that a match signal is not output for long time.

A concrete example will be described. It is now assumed that reception time of a first packet is 700 µs in the system cycle timer 120, and time of the true time stamp added to the packet is 1500 µs. When the switching timing of the switch 160 is packet reception start time, a match signal is not output since output of the match signal based on a dummy time-stamp is finished until the system cycle timer 120 becomes 1500 µs. In contrast, in the embodiment, the switching timing is controlled as described above, so that output of the match signal by the dummy time-stamp can be continued also after the packet is received, and it can be suppressed that a match signal is not output for long time.

When the switch 160 switches, the comparator 180 starts comparison between the true time-stamp held in the time stamp register 152 and the system cycle timer 120. Therefore, after 575 µs of the dummy time-stamp and the time of the system cycle timer 120 are compared, in the next comparison cycle, 750 µs of the true time-stamp and the time of the system cycle timer 120 are compared. After that, the comparator 180 compares the true time-stamp added to the packet and the time of the system cycle timer 120 and outputs a match signal.

When the comparison process of the comparator 180 starts, a match signal is sequentially supplied to the PLL 190. When the match signal is supplied until it becomes a state in which multiplication can be performed, the PLL 190 starts outputting a clock signal obtained by multiplying the input signal by the set multiplication rate.

The transmission/reception system 8 having the reception device 10 has been described above. According to the reception device 10, a clock signal is generated by using the dummy time-stamp generated by the dummy time-stamp generation unit 130. Consequently, the reception device 10 can generate a clock also before reception of a packet. For example, there is a case that a clock has to be supplied to a DAC which processes audio data in order to set a sampling frequency or the like to the DAC. In the case of generating a clock only by a time stamp added to a reception packet, therefore, a setting cannot be made in the DAC before reception of a packet. There is the possibility that the DAC cannot properly process audio data. In contract, the reception device 10 can generate a clock also before reception of a packet, so that a setting or the like can be performed in the DAC by the clock in advance.

Second Embodiment

Next, a second embodiment will be described. In the embodiment, a reception device capable of solving a deviation of cycles of match signals, which occurs at the time of switching of the switch 160 will be described. In the reception device 10 according to the first embodiment, as illustrated in FIG. 4, the cycle of a signal supplied to the PLL 190 fluctuates in association with the switching of the switch 160. Concretely, the cycle becomes as follows. Before switching of the switch 160, that is, while comparison using the dummy time-stamp is performed, the match signal is supplied to the PLL 190 every 125 µs. However, the cycle in which the switch 160 is switched and the match signal by comparison of the true time-stamp is supplied to the PLL 190 becomes 175 µs (=750 µs−575 µs) and fluctuates once. After that, every 125 µs, the match signal is supplied again to the PLL 190. Therefore, the cycle of the clock output from the PLL 190 fluctuates.

Figure 5:
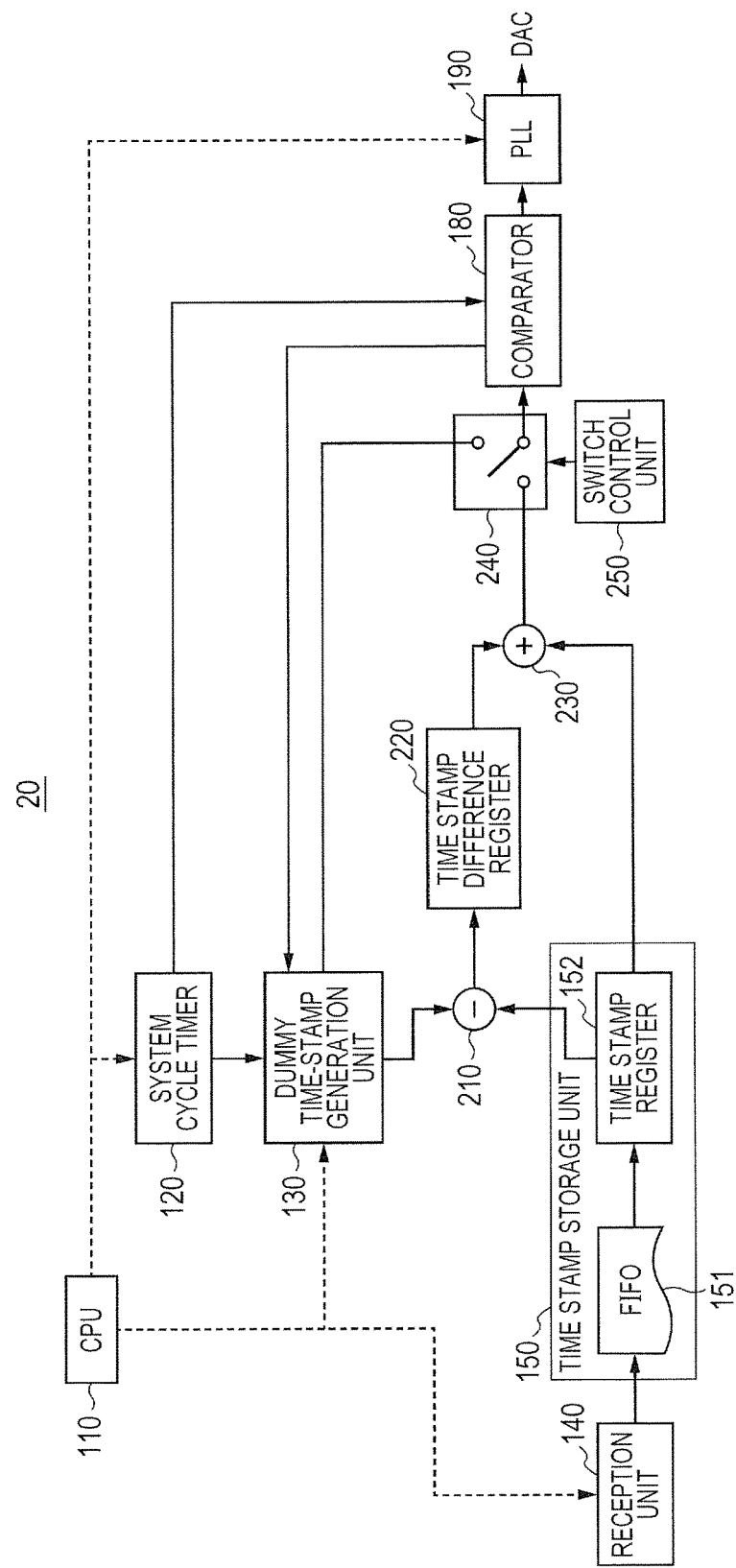
FIG. 5 is a block diagram illustrating a configuration example of a reception device according to a second embodiment.

FIG. 5 is a block diagram illustrating a configuration example of a reception device 20 according to the second embodiment. As illustrated in FIG. 5, the reception device 20 according to the second embodiment is different from the reception device 10 according to the first embodiment with respect to points that a computing unit 210, a time stamp difference register 220, and a computing unit 230 are added, and the switch 160 and the switch control unit 170 are replaced by a switch 240 and a switch control unit 250, respectively. Hereinafter, the points different from the first embodiment will be described in detail and repetitive description will be properly omitted.

The computing unit 210 computes the difference value between the time of the true time-stamp included in the packet transmitted from the transmission device 9 which is received first by the reception unit 140 and the time of the dummy time-stamp generated by the dummy time-stamp generation unit 130. In the embodiment, the computing unit 210 is, concretely, a subtractor and subtracts the time of the true time-stamp added to the first packet from the time of the dummy time-stamp generated immediately after reception of the first packet.

The time stamp difference register 220 is a register holding a computation result of the computing unit 210. The computing unit 210 stores the difference value as a computation result in the time stamp difference register 220.

The computing unit 230 performs computation of shifting the true time-stamp only by the difference value. In the embodiment, the computing unit 230 is concretely an adder and adds the difference value held in the time stamp difference register 220 to the time of the true time-stamp held in the time stamp register 152.

Like the switch 160, the switch 240 is a switch selecting a time stamp which is supplied to the comparator 180 and is controlled by the switch control unit 170. Concretely, the switch 240 selects, as the time stamp supplied to the comparator 180, either the dummy time-stamp output from the dummy time-stamp generation unit 130 or the computed true time-stamp which is output from the computing unit 230.

As described above, in the embodiment, when performing comparison using the true time-stamp, the comparator 180 compares the time of the true time-stamp obtained by shifting the value only by the difference value computed by the computing unit 210 and the time indicated by the system cycle timer 120. For each comparing operation by the comparator 180, the time stamp held in the time stamp register 152 is computed by the computing unit 230 and the resultant is output to the comparator 180.

The switch control unit 250 is a control circuit controlling the switch 240. The switch control unit 250 supplies the dummy time-stamp to the comparator 180 until a predetermined condition is satisfied and, after the predetermined condition is satisfied, controls so as to supply the true time-stamp computed by the computing unit 230 to the comparator 180. Concretely, the switch control unit 250 controls the switch 240 so as to supply the dummy time-stamp generated by the dummy time-stamp generation unit 130 to the comparator 180 until the first packet is received by the reception unit 140 and, after the first packet is received, controls the switch 240 so as to supply the computed true time-stamp output from the computing unit 230 to the comparator 180. Therefore, in the initial state, the switch 240 selects the dummy time-stamp output from the dummy time-stamp generation unit 130 as a time stamp supplied to the comparator 180. The switch 240 is switched to the computing unit 230 side after reception of the packet by the reception unit 140.

In the embodiment, different from the first embodiment, it is unnecessary to wait for switching of the switch 240 until the difference between the dummy time-stamp and the time of the first true time-stamp becomes less than the dummy cycle time. The reason is that, in the embodiment, the time of the true time-stamp is not supplied as it is to the comparator 180 but the time shifted only by the difference value is supplied to the comparator 180. In other words, in the embodiment, the time of the true time-stamp is shifted so that the cycles of time stamps supplied to the comparator 180 become constant.

Figure 6:
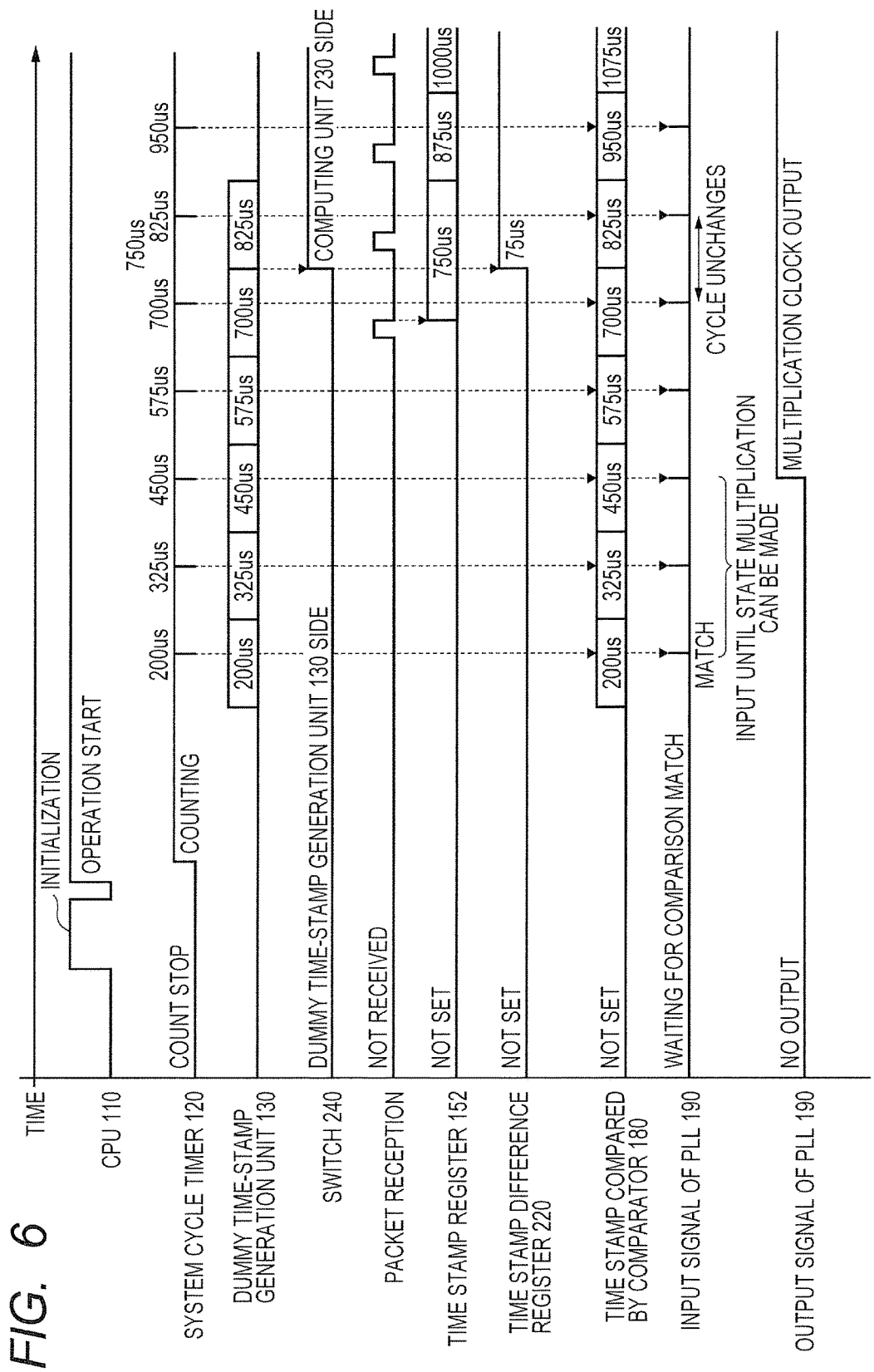
FIG. 6 is a timing chart illustrating an example of operations of the reception device according to the second embodiment.

Next, an operation example of the reception device 20 according to the second embodiment will be described. FIG. 6 is a timing chart illustrating an example of operations of the reception device 20 according to the second embodiment. With reference to FIG. 6, the operations of the reception device 20 will be described. In FIG. 6, since the timing charts related to the handshakes and the timing charts of the transmission device 9 are similar to those in FIG. 1, they are not illustrated.

In the embodiment, since the timing charts of the CPU 110, the system cycle timer 120, the dummy time-stamp generation unit 130, packet reception, and the time stamp register 152 are similar to those in FIG. 4 according to the first embodiment, the description will not be repeated. Hereinafter, the points different from the timing charts illustrated in FIG. 4 will be mainly described.

The switch 240 is coupled to the dummy time-stamp generation unit 130 side in the initial state. Therefore, the time stamp compared in the comparator 180 is a dummy time-stamp output from the dummy time-stamp generation unit 130. When the dummy time-stamp generation unit 130 starts generation of a dummy time-stamp, the comparator 180 compares the generated dummy time-stamp and the time of the system cycle timer 120. After reception of a packet by the reception unit 140 starts, the switch 240 is switched to be coupled to the computing unit 230 side. Consequently, an object to be compared by the comparator 180 after the switch 240 is switched is switched to an output of the computing unit 230.

When reception of a packet starts, the computing unit 210 computes the difference value between the dummy time-stamp generated immediately after reception of the first packet and the time of the true time-stamp included in the packet received first. Then, the difference value is set in the time stamp difference register 220. In the example illustrated in FIG. 6, the time (750 µs) of the true time-stamp included in the packet received first is subtracted from the time (825 µs) of the dummy time-stamp generated immediately after reception of the first packet, and the difference value (75 µs) is set in the time stamp difference register 220.

When the switch 240 switches, the comparator 180 starts comparison of the time obtained by adding the value held in the time stamp difference register 220 to the time held in the time stamp register 152 with the system cycle timer 120. Therefore, referring to FIG. 6, the comparator 180 compares each of 200 µs, 325 µs, 450 µs, 575 µs, and 700 µs as outputs of the dummy time-stamp generation unit 130 with the system cycle timer 120 and, in the following comparison cycle, compares 825 µs as an output of the computing unit 230 with the system cycle timer 120. 825 µs as an output of the computing unit 230 is a result of addition of 750 µs as time of the true time-stamp included in the packet received first and 75 µs as the value held in the time stamp difference register 220. After that, the comparator 180 compares a value shifted from the time of each of the true time-stamps received only by the difference value with the time of the system cycle timer 120 and outputs a match signal.

Also in the embodiment, after the comparing process of the comparator 180 starts, even before reception of a packet, a match signal is supplied sequentially to the PLL 190. In the embodiment, a match signal is supplied to the PLL 190 in predetermined cycles. When the match signal is supplied until it becomes a state where multiplication can be performed, the PLL 190 starts outputting a clock signal obtained by multiplying the input signal by a set multiplication rate.

In the reception device 20, as described above, the time of the true time-stamp is not supplied as it is to the comparator 180 but time obtained by shifting the time only by the difference value between the time of the true time-stamp of the packet received first and the time of the dummy time-stamp is supplied to the comparator 180. Consequently, as illustrated in FIG. 6, regardless of the switching timing of the switch 240, the cycle of the time of the time stamp to be compared by the comparator 180 is always constant (125 µs). Therefore, the cycle of the match signal supplied to the PLL 190 becomes also constant, and fluctuations of the cycle of the clock output by the PLL 190 are suppressed. That is, according to the reception device 20, while generating clocks also before reception of packets, fluctuations of the cycle of the PLL 190 can be suppressed.

In the configuration illustrated in FIG. 5, the example in which the computing device unit 230 is comprised of an adder is illustrated. However, this is just an example. For example, in the case such that the computing unit 210 subtracts the time of the dummy time-stamp generated immediately after reception of the first packet from the time of the true time-stamp added to the first packet, the computing unit 230 may be configured as a subtractor. In this case, the computing unit 230 is configured as, for example, a subtractor subtracting the difference value calculated by the computing unit 210 from the time of the true time-stamp. This similarly applies not only to the configuration of the embodiment but also to the configuration of a third embodiment described later, and a configuration obtained by combining a configuration according to any of fourth and subsequent embodiments and the configuration of the second embodiment.

Third Embodiment

Next, a third embodiment will be described. In the embodiment, a reception device capable of synchronizing the phase of a match signal supplied to the PLL 190 with the phase of a true time-stamp added to a reception packet will be described. In the reception device 20 according to the second embodiment, the phase of the match signal supplied to the PLL 190 remains as the phase of the dummy time-stamp also after the switch 240 is switched. This is because that the time of the true time-stamp is always shifted only by the predetermined difference value in the comparison by the comparator 180 using the true time-stamp. That is, the phase of the time stamp supplied to the comparator 180 is always shifted from the original phase of the true time-stamp only by the difference value. Therefore, although the reception device 20 according to the second embodiment generates a match signal of a predetermined cycle intended by the transmission device 9, also after switching of the switch 240, the output timing of the match signal is continuously shifted from the time of the true time-stamp.

The reason why the phase difference continues as described above is because the value shifted from the time of the true time-stamp only by the predetermined difference value is used as an input of the comparator 180. In other words, the difference value supplied to the computing unit 230 is always constant. The reception device according to the embodiment gradually decreases the difference value computed by the computing unit 210 until the phase difference becomes zero every comparison using a true time-stamp by the comparator 180.

Figure 7:
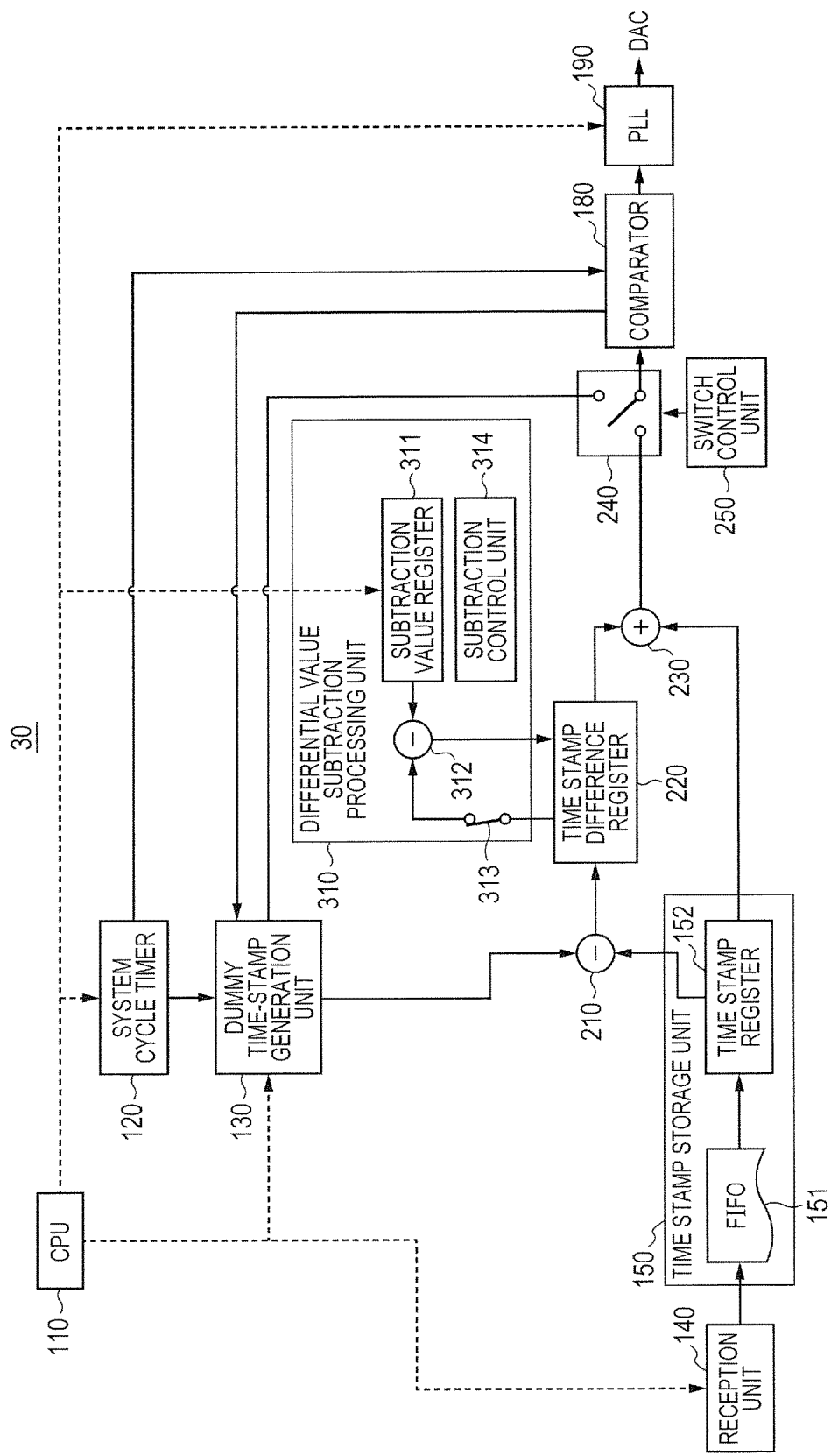
FIG. 7 is a block diagram illustrating a configuration example of a reception device according to a third embodiment.

FIG. 7 is a block diagram illustrating a configuration example of a reception device 30 according to a third embodiment. As illustrated in FIG. 7, the reception device 30 according to the third embodiment is different from the reception device 20 according to the second embodiment with respect to the point that a differential value subtraction processing unit 310 is added. Hereinafter, the point different from the second embodiment will be described in detail, and repetitive description will be properly omitted.

The differential value subtraction processing unit 310 has a subtraction value register 311, a computing unit 312, a switch 313, and a subtraction control unit 314 and, with the configuration, decreases the absolute value of the difference value computed by the computing unit 210 every comparison using the true time-stamp by the comparator 180 only by the predetermined value.

The subtraction value register 311 holds a subtraction value for decreasing the difference value held in the time stamp difference register 220. In the embodiment, the subtraction value is set in the initial setting by the CPU 110.

The computing unit 312 is a subtractor decreasing the absolute value of the difference value computed by the computing unit 210 only by the predetermined value. In the embodiment, concretely, the computing unit 312 decreases the difference value held in the time stamp difference register 220 only by the value set in the subtraction value register 311. The computing unit 312 stores the computation result in the time stamp difference register 220. That is, when the computation by the computing unit 312 is performed, the difference value held in the time stamp difference register 220 is updated. Consequently, when the computation by the computing unit 312 is repeated, the absolute value of the difference value held in the time stamp difference register 220 gradually approaches zero.

The switch 313 is provided between the time stamp difference register 220 and the computing unit 312 and is a switch selecting whether the difference value held in the time stamp difference register 220 can be supplied to the computing unit 312 or not. The switch 313 is controlled by the subtraction control unit 314.

The subtraction control unit 314 is a control circuit controlling a difference value subtracting process. The subtraction control unit 314 checks the difference value held in the time stamp difference register 220 and, when the absolute value of the difference value is not zero, controls the switch 313 in the on state and, when the absolute value of the difference value of the time stamp difference register 220 is zero, switches the switch 313 to the off state to finish the subtracting process.

In the embodiment, when performing comparison using a true time-stamp, the comparator 180 compares the time of a true time-stamp whose value is shifted only by the difference value after computation by the difference value subtraction processing unit 310 with the time indicated by the system cycle timer 120.

As described above, in the embodiment, the difference value subtraction processing unit 310 brings the difference value gradually close to zero so that, finally, the phase of the match signal supplied to the PLL 190 can be synchronized with the phase of the true time-stamp added to the reception packet.

Next, an operation example of the reception device 30 according to the third embodiment will be described. FIGS. 8A and 8B are timing charts illustrating an example of operations of the reception device 30 according to the third embodiment. Hereinafter, with reference to FIGS. 8A and 8B, the operations of the reception device 30 will be described. In FIGS. 8A and 8B, since the timing charts related to handshakes and the timing charts of the transmission device 9 are similar to those in the first embodiment, they are not illustrated.

In the embodiment, since the timing charts of the CPU 110, the system cycle timer 120, the dummy time stamp generation unit 130, the switch 240, packet reception, and the time stamp register 152 are similar to those in FIG. 6 according to the first embodiment, the description will not be repeated. In the embodiment, as an initial setting, the CPU 110 further sets a subtraction value to the subtraction value register 311. Hereinafter, the points different from the timing charts illustrated in FIG. 6 will be mainly described.

In the subtraction value register 311, in the initial setting by the CPU 110, a predetermined subtraction value is set. As an example, 5 µs is set.

The switch 313 is on in the initial state. That is, in the initial state, the time stamp difference register 220 and the computing unit 312 are coupled.

Also in the embodiment, in the initial state, the time stamp compared by the comparator 180 is the dummy time-stamp output from the dummy time-stamp generation unit 130. Therefore, when the dummy time-stamp generation unit 130 starts generating the dummy time-stamp, the comparator 180 compares the generated dummy time-stamp and the time of the system cycle timer 120. After reception of packets by the reception unit 140 starts, the switch 240 is switched to be coupled to the computing unit 230 side. Consequently, an object to be compared by the comparator 180 after the switch 240 is switched is switched to the output of the computing unit 230.

Also in the embodiment, after reception of packets starts, the computing unit 210 computes the difference value between the dummy time-stamp generated immediately after reception of the first packet and the time of the true time-stamp included in the packet received first. By the operation, the difference value (75 µs) as the computation result is set first in the time stamp difference register 220. Although the value of the time stamp difference register 220 is constant in the second embodiment, in the third embodiment, the value gradually decreases by the process of the difference value subtraction processing unit 310. That is, as illustrated in FIGS. 8A and 8B, the value of the time stamp difference register 220 decreases by the value (5 µs) of the subtraction value register 311 every comparison using the true time-stamp by the comparator 180. When the value of the time stamp difference register 220 becomes zero, the switch 313 is switched to off, and subtraction by the difference value subtraction processing unit 310 is finished.

After switching of the switch 240, the comparator 180 compares the time obtained by adding the value held in the time stamp difference register 220 to the time held in the time stamp register 152 with the system cycle timer 120. Consequently, the change in the value of the time stamp difference register 220 is reflected in the value supplied to the comparator 180. Therefore, although the time stamp value compared by the comparator 180 continues like 825 µs, 950 µs, 1075 µs, . . . after the comparison using the dummy time-stamp in the second embodiment, in the third embodiment, the value continues like 825 µs, 945 µs, 1065 µs, . . . so that the interval of the time stamps becomes shorter by 5 µs as compared with the second embodiment. Consequently, the difference between the time stamp value compared by the comparator 180 and the value of the true time-stamp gradually decreases. In the example illustrated in FIGS. 8A and 8B, at the time point when the value of the true time stamp added to the packet becomes 2625 µs, the difference between the time stamp value compared by the comparator 180 and the value of the true time-stamp becomes zero. That is, after that, the phases are synchronized completely.

Also in the embodiment, when the comparing process of the comparator 180 starts, the match signal is supplied sequentially also before reception of packets to the PLL 190. In the embodiment, the match signal is supplied almost in constant cycles to the PLL 190. Specifically, while subtraction by the difference value subtraction processing unit 310 is performed, the cycle is changed only by the subtraction value as compared with a period in which subtraction by the difference value subtraction processing unit 310 is not performed. In the example illustrated in FIGS. 8A and 8B, the cycle of the period in which subtraction by the difference value subtraction processing unit 310 is performed is 120 µs which is shorter than 125 µs as the cycle of the period in which the subtraction by the difference value subtraction processing unit 310 is not performed only by 5 µs. Therefore, the smaller the value which is set in the subtraction value register 311 is, the more fluctuations of the cycle can be suppressed. However, the smaller the value which is set in the subtraction value register 311 is, the longer the time required to completely synchronize the phases becomes.

In the reception device 30, like in the second embodiment, the time of the true time-stamp is not supplied as it is to the comparator 180 but time obtained by shifting the time only by the difference value is supplied to the comparator 180. Consequently, fluctuations of the cycle of the match signal supplied to the PLL 190 are suppressed. In the reception device 30, the difference value gradually decreases. The phase of the match signal supplied to the PLL 190 and the phase of the true time-stamp added to the reception packet can be synchronized. Therefore, while generating the clocks also before reception of the packets, fluctuations of the cycles of the PLL 190 and deviation of phases can be suppressed.

Fourth Embodiment

Next, a fourth embodiment will be described. For example, there is a case that a system for synchronizing an audio output timing to an external device such as a DAC with a true time-stamp to reproduce audio data of a moving picture in accordance with a video image is required. It seems that such a system is realized by applying the technique described in Japanese Unexamined Patent Application Publication No. Hei 9 (1997)-128894 of synchronizing the output timing of an audio signal with that of a video signal. In the technique described in the publication, however, the output timing from a decode buffer unit is simply synchronized with a time stamp. In the case where a process delay occurs in a processing unit in a post stage of the decode buffer unit, the output timing to an external device such as a DAC is not synchronized with the true time-stamp. That is, the output timing is deviated from the time of the true time-stamp. Therefore, in the embodiment, a reception device 40 capable of suppressing the deviation will be described.

Figure 9:
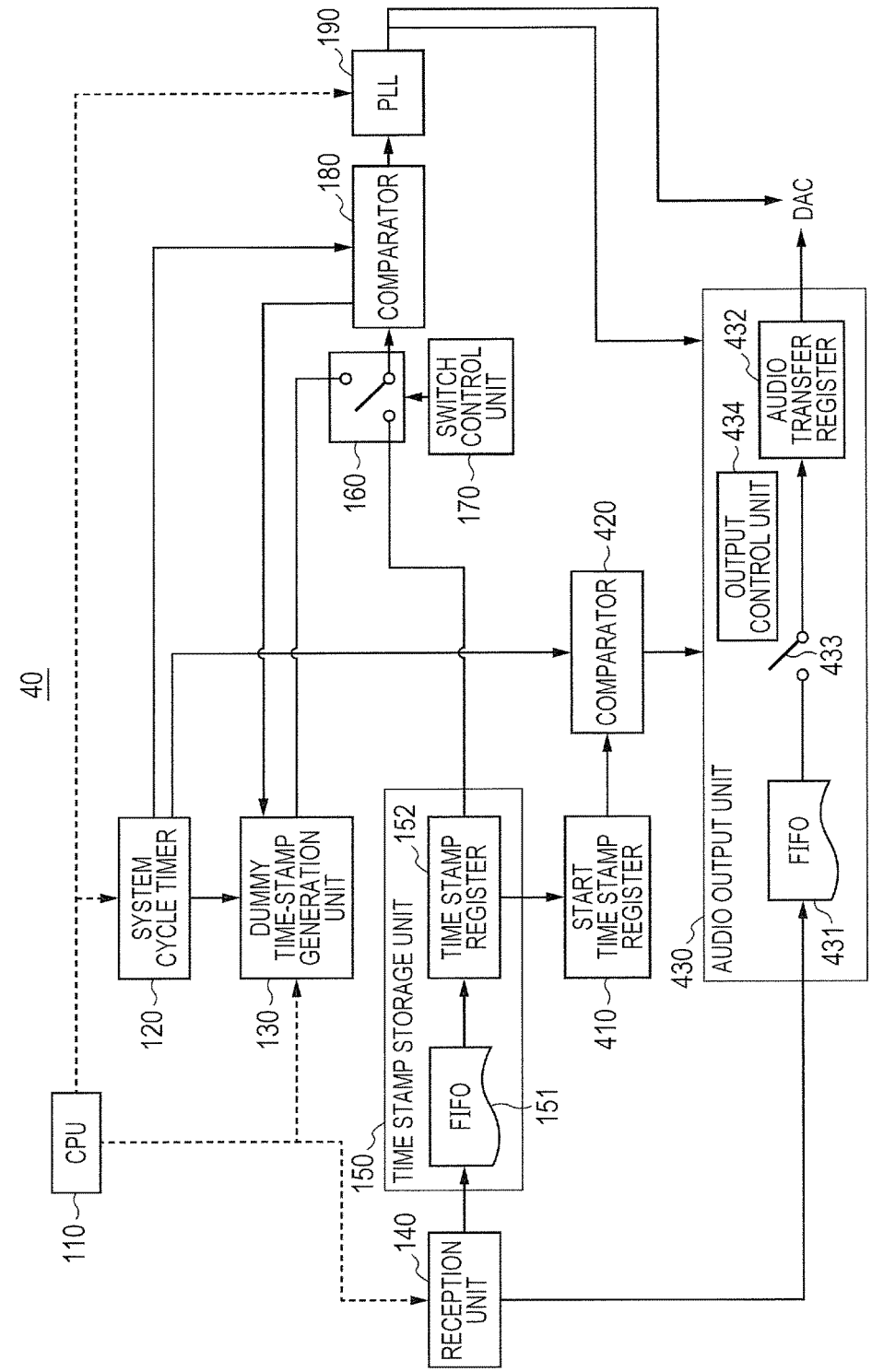
FIG. 9 is a block diagram illustrating a configuration example of a reception device according to a fourth embodiment.

FIG. 9 is a block diagram illustrating a configuration example of the reception device 40 according to the fourth embodiment. As illustrated in FIG. 9, the reception device 40 of the fourth embodiment is different from the reception device 10 according to the first embodiment with respect to the point that a start time stamp register 410, a comparator 420, and an audio output unit 430 are added. Hereinafter, the point different from the first embodiment will be described in detail and repetitive description will not be properly omitted.

The start time stamp register 410 is a register holding the time of a true time-stamp included in the packet received first. In the embodiment, the time stamp stored first in the time stamp register 152 is copied to the start time stamp register 410 by the control of, for example, the CPU 110 or another control circuit.

The comparator 420 is a comparison circuit comparing the time of the true time-stamp included in the packet first received and held in the start time stamp register 410 and the time indicated by the system cycle timer 120. When both of the times match, the comparator 420 outputs a match signal to the audio output unit 430.

The audio output unit 430 has an FIFO 431, an audio transfer register 432, a switch 433, and an output control unit 434 and operates by using a clock supplied from the PLL 190.

The FIFO 431 is a buffer of an FIFO (First In First Out) type of holing audio data included in a received packet. In FIG. 9, it is illustrated that audio data included in the packet received by the reception unit 140 is supplied directly to the FIFO 431. Alternatively, as the audio data supplied to the FIFO 431, audio data subject to an arbitrary process such as sampling rate conversion may be supplied.

The audio transfer register 432 is a register storing audio data which is output to the output device including a DAC. In the embodiment, concretely, the audio transfer register 432 is a register storing audio data of one sample. The audio data stored in the audio transfer register 432 is serially output to the DAC bit by bit. To the DAC, clocks are supplied from the PLL 190. As described above, the audio transfer register 432 is a final mechanism for outputting audio data from the reception device 40 to an external device. When audio data is stored in the audio transfer register 432, the audio data stored is immediately serially output bit by bit.

The switch 433 is a switch provided between the FIFO 431 and the audio transfer register 432 and selecting whether audio data held in the FIFO 431 can be supplied to the audio transfer register 432 or not. The switch 433 is controlled by the output control unit 434. The switch 433 is off in the initial state.

The output control unit 434 is a control circuit controlling output of audio data to an external device. Particularly, in the embodiment, the output control unit 434 controls input timings of audio data from the FIFO 431 to the audio transfer register 432. Concretely, the output control unit 434 controls so as to supply audio data from the FITO 431 to the audio transfer register 432 at a timing when the comparator 420 determines that the time indicated by the system cycle timer 120 matches the time of the true time-stamp included in the packet received first. More specifically, the output control unit 434 turns on the switch 433 in response to a match signal from the comparator 420, thereby making the audio transfer register 432 hold the first sampling data included in the first reception packet. That is, in the reception device 40, at the timing when the time indicated by the system cycle timer 120 matches the time of the first true time-stamp, the switch 433 is turned on, and output of the audio data to an external device starts. On completion of output of data of one sample stored in the audio storage register 432, the output control unit 434 controls so as to transfer the next sample from the FIFO 431 to the audio transfer register 432. By the operation, the next sample will be also serially transmitted to an external device.

According to the reception device 40, as described above, audio data is supplied to the audio transfer register 432 as the final mechanism for outputting audio data from the reception device 40 to an external device at a timing when time indicated by the system cycle timer 120 matches the time of the first true time-stamp. Consequently, a deviation between the time of the true time-stamp included in the first packet and the start time of audio data output from the reception device 40 to an external device can be suppressed. In other words, the output timing of the audio data from the reception device 40 to an external device can be synchronized with the true time-stamp.

Although the configuration obtained by adding the configuration of the audio output control to the configuration illustrated in the first embodiment is described in the fourth embodiment, the configuration of the audio output control described in the fourth embodiment may be added to the configuration of any of the first to third embodiments.

Fifth Embodiment

Figure 10:
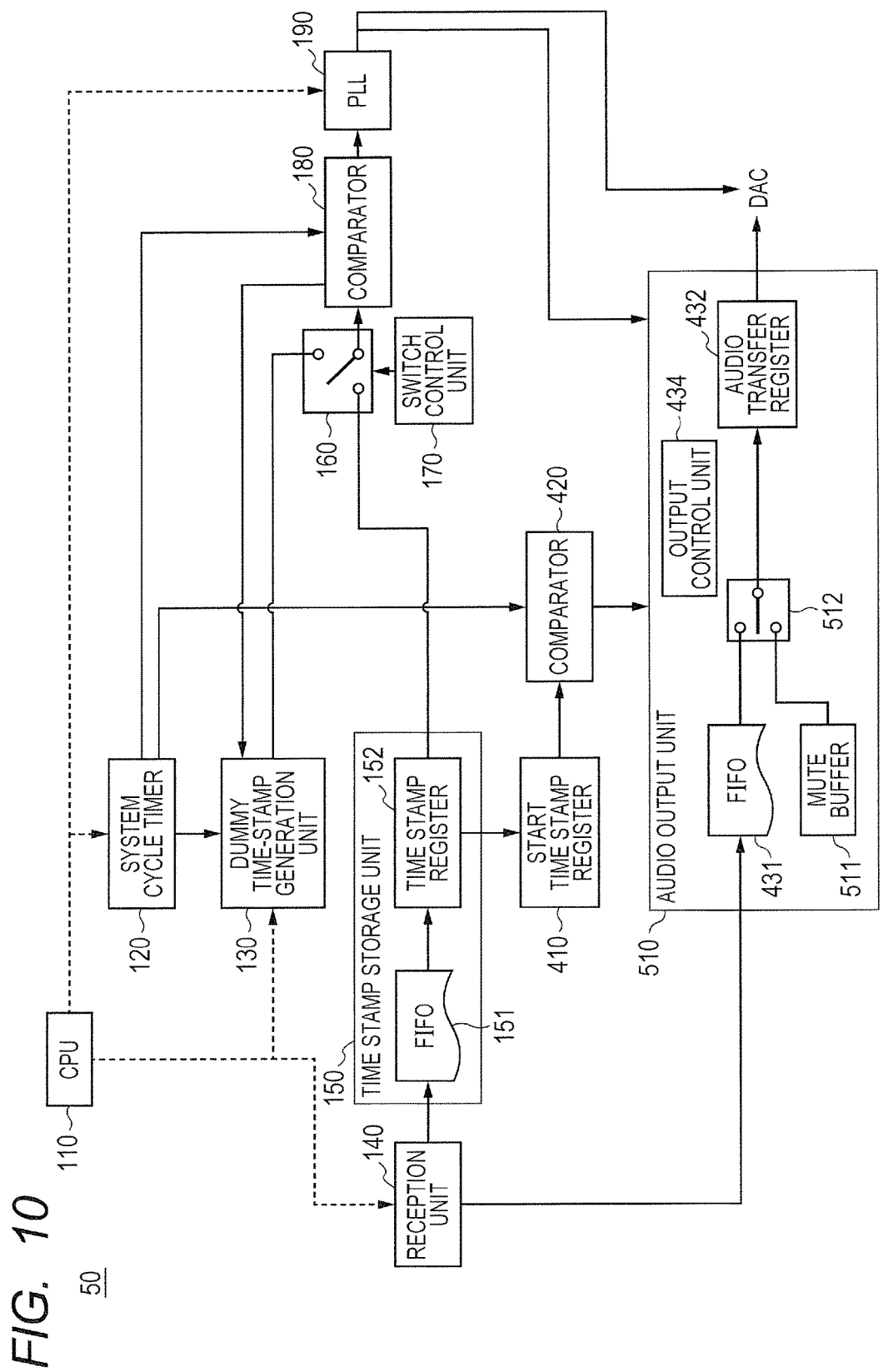
FIG. 10 is a block diagram illustrating a configuration example of a reception device according to a fifth embodiment.

Next, a fifth embodiment will be described. FIG. 10 is a block diagram illustrating a configuration example of a reception device 50 according to a fifth embodiment. As illustrated in FIG. 10, the reception device 50 according to the fifth embodiment is different from the reception device 40 according to the fourth embodiment with respect to the point that the audio output unit 430 is replaced by an audio output unit 510. The audio output unit 510 is different from the audio output unit 430 according to the fourth embodiment with respect to the point that a mute buffer 511 is added and the switch 433 is replaced by a switch 512. Hereinafter, the points different from the fourth embodiment will be described in detail, and repetitive description will be properly omitted.

The mute buffer 511 is a buffer for holding mute data. In the mute buffer 511, mute data as silence data is preliminarily held.

The switch 512 is a switch for selecting data supplied to the audio transfer register 432 and is controlled by the output control unit 434. Concretely, the switch 512 selects either audio data held in the FIFO 431 or the mute data held in the mute buffer 511 as data supplied to the audio transfer register 432. The switch 512 is coupled to the mute buffer 511 side in the initial state.

The output control unit 434 of the embodiment controls so as to supply mute data from the mute buffer 511 to the audio transfer register 432 until the time indicated by the system cycle timer 120 matches the time of the true time-stamp included in the packet received first. When the time indicated by the system cycle timer 120 matches the time of the true time-stamp included in the packet received first, the output control unit 434 controls to supply audio data from the FIFO 431 to the audio transfer register 432. Concretely, when the match signal is output from the comparator 420, the output control unit 434 switches the switch 512 from the mute buffer 511 side to the FIFO 431 side.

According to the reception device 50, mute data is output from the reception device 50 until output of audio data from the reception device 50 starts. Consequently, according to the reception device 50, unintended audio other than audio data can be prevented from being reproduced before reproduction of the audio data.

Although a configuration obtained by adding the configuration of the audio output control to the configuration illustrated in the first embodiment has been described in the fifth embodiment, the configuration of the audio output control described in the fifth embodiment may be added to the configuration of any of the first to third embodiments.

Sixth Embodiment

Figure 11:
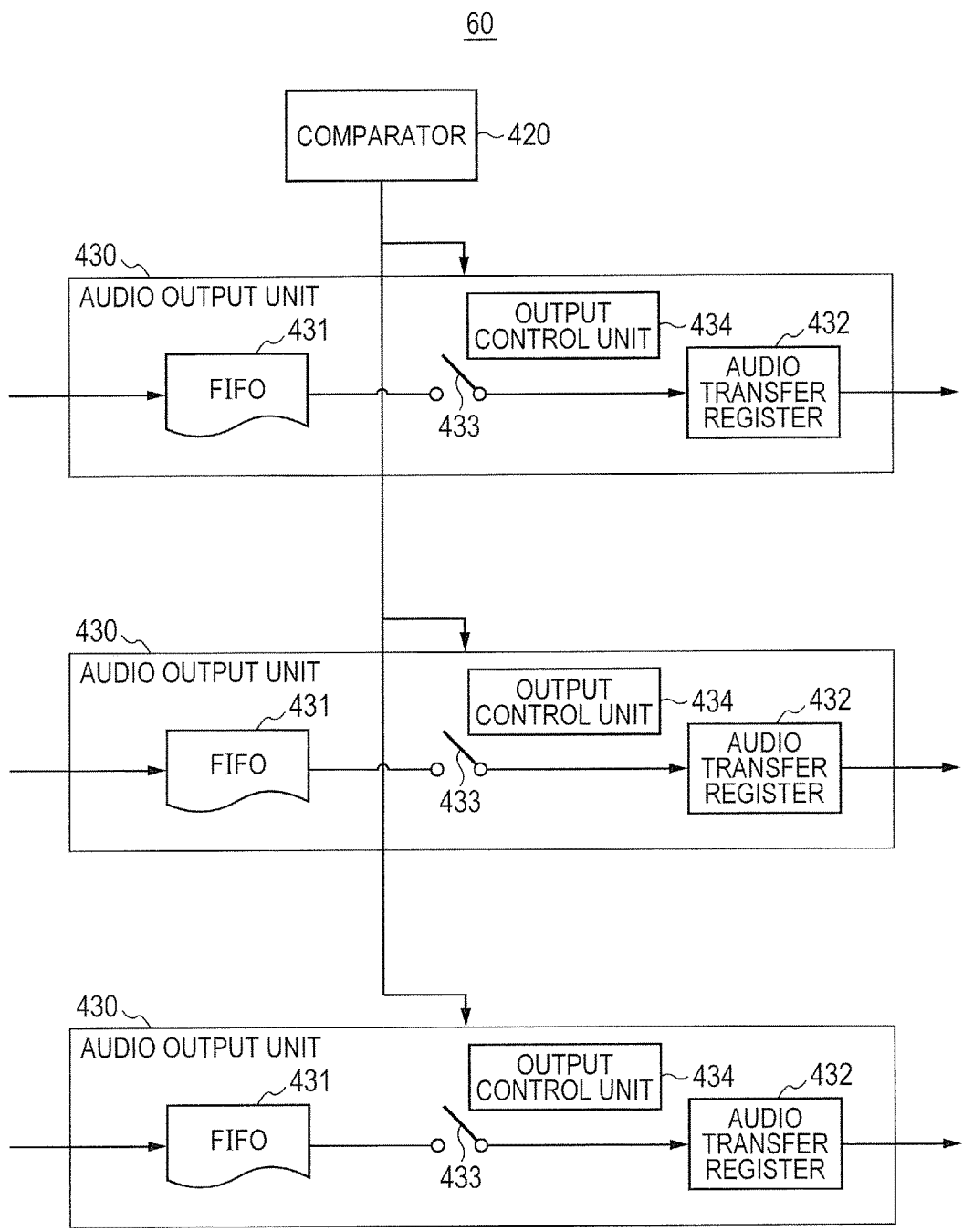
FIG. 11 is a block diagram illustrating a configuration example of a reception device according to a sixth embodiment.

Next, a sixth embodiment will be described. In the embodiment, a reception device having a plurality of audio output units will be described. FIG. 11 is a block diagram illustrating a configuration example of a reception device 60 according to the sixth embodiment. The reception device 60 according to the sixth embodiment has a plurality of audio output units 430. The reception device 60 is a reception device capable of performing multichannel outputs. In FIG. 11, only the comparator 420 and the plurality of audio output units 430 are illustrated, and the other components illustrated in FIG. 9 are not illustrated.

In the embodiment, the match signal from the comparator 420 is commonly used by the audio output units 430. The output control units 434 of the audio output units 430 control so that audio data is supplied from the FIFOs 431 to the audio transfer registers 432 at the same timing in accordance with a determination result of the comparator 420. That is, by the match signal from the comparator 420, the output control units 434 of the audio output units 430 switch the switches 433 to start output of audio data at the same timing.

According to the reception device 60, the audio output units 430 start outputting audio data at the same timing in response to the match signal from the comparator 420. Therefore, a plurality of audio output timings of multiple channels can be synchronized with the true time-stamp.

In the embodiment, the configuration having a plurality of audio output units 430 according to the fourth embodiment has been described. In the configuration having the plurality of audio output units 510 according to the fifth embodiment, the above-described configuration of commonly using the match signal of the comparator 420 may be also applied. Alternatively, regarding the configuration other than the audio output control, the configuration of any of the first to third embodiments may be employed.

Seventh Embodiment

Next, a seventh embodiment will be described. In a transmission/reception system in which a plurality of reception devices receiving a packet including audio data and a time stamp transmitted from a transmission device exist on a network, it is requested to synchronize audio data reproduction timings. In this case, the reception devices receive packets to which the same true time-stamp is added. The reception devices output the audio data to different external devices. According to the reception devices of the fourth to sixth embodiments, the output timings of audio data to the external devices such as a DAC can be synchronized. However, in the case where a delay occurs in any of the external devices, variations occur in audio data reproduction timings. In the seventh embodiment, therefore, a reception device capable of suppressing variations in the reproduction timings in such a system will be described.

Figure 12:
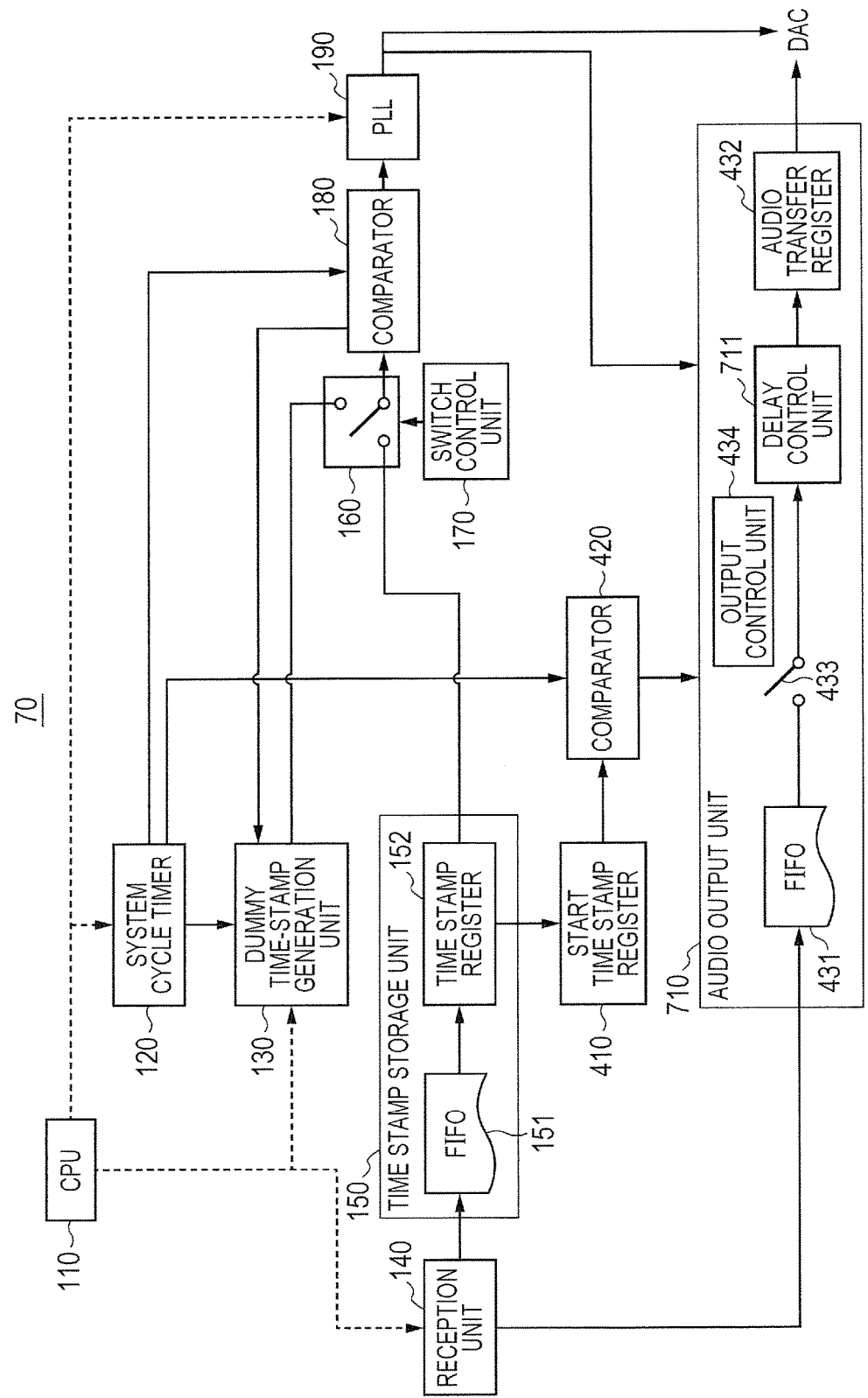
FIG. 12 is a block diagram illustrating a configuration example of a reception device according to a seventh embodiment.

FIG. 12 is a block diagram illustrating a configuration example of a reception device 70 according to a seventh embodiment. As illustrated in FIG. 12, the reception device 70 according to the seventh embodiment is different from the reception device 40 according to the fourth embodiment with respect to the point that the audio output unit 430 is replaced by an audio output unit 710. The audio output unit 710 is different from the audio output unit 430 according to the fourth embodiment with respect to the point that a delay control unit 711 is added between the switch 433 and the audio transfer register 432. Hereinafter, the point different from the fourth embodiment will be described in detail and repetitive description will be properly omitted.

The delay control unit 711 is a control circuit for delaying an audio data input timing from the FIFO 431 to the audio transfer register 432. The delay control unit 711 delays the timing of supplying audio data output from the FIFO 431 to the audio transfer register 432 only by predetermined delay time. The delay control unit 711 has, for example, a buffer, temporarily holds audio data supplied to the delay control unit 711 in the buffer for the predetermined delay time and, after that, outputs the audio data to the audio transfer register 432. Actual delay time of each external device is known by an arbitrary analyzing method such as simulation, and the delay time set in the delay control unit 711 is preliminarily set in the delay control unit 711 on the basis of the analysis result.

As described above, in the reception device 70, the delay control unit 711 delays the audio data output timing only by predetermined delay time. Consequently, the reproduction timings can be set at the latest reproduction timing. Therefore, in the case where packets transmitted from a transmission device are received by a plurality of reception devices, variations of the audio data reproduction timings can be suppressed.

Although the configuration obtained by adding the delay control unit 711 to the audio output unit 430 according to the fourth embodiment is illustrated as the audio output unit 710 in the seventh embodiment, a configuration obtained by adding the delay control unit 711 to the audio output unit 510 according to the fifth embodiment may be also set as the audio output unit 710. In this case, the delay control unit 711 is provided between the switch 512 and the audio transfer register 432. The reception device 70 may have a configuration of multiple channels as described in the sixth embodiment. In the seventh embodiment, as the configuration other than the audio output control, the configuration of any of the first to third embodiments may be employed.

Eighth Embodiment

Next, an eighth embodiment will be described. In the seventh embodiment, by providing the delay control unit 711, the audio data reproduction timings are synchronized in the transmission/reception system in which a plurality of reception devices exist on a network. In the embodiment, by another configuration, the audio data reproduction timings are synchronized.

Figure 13:
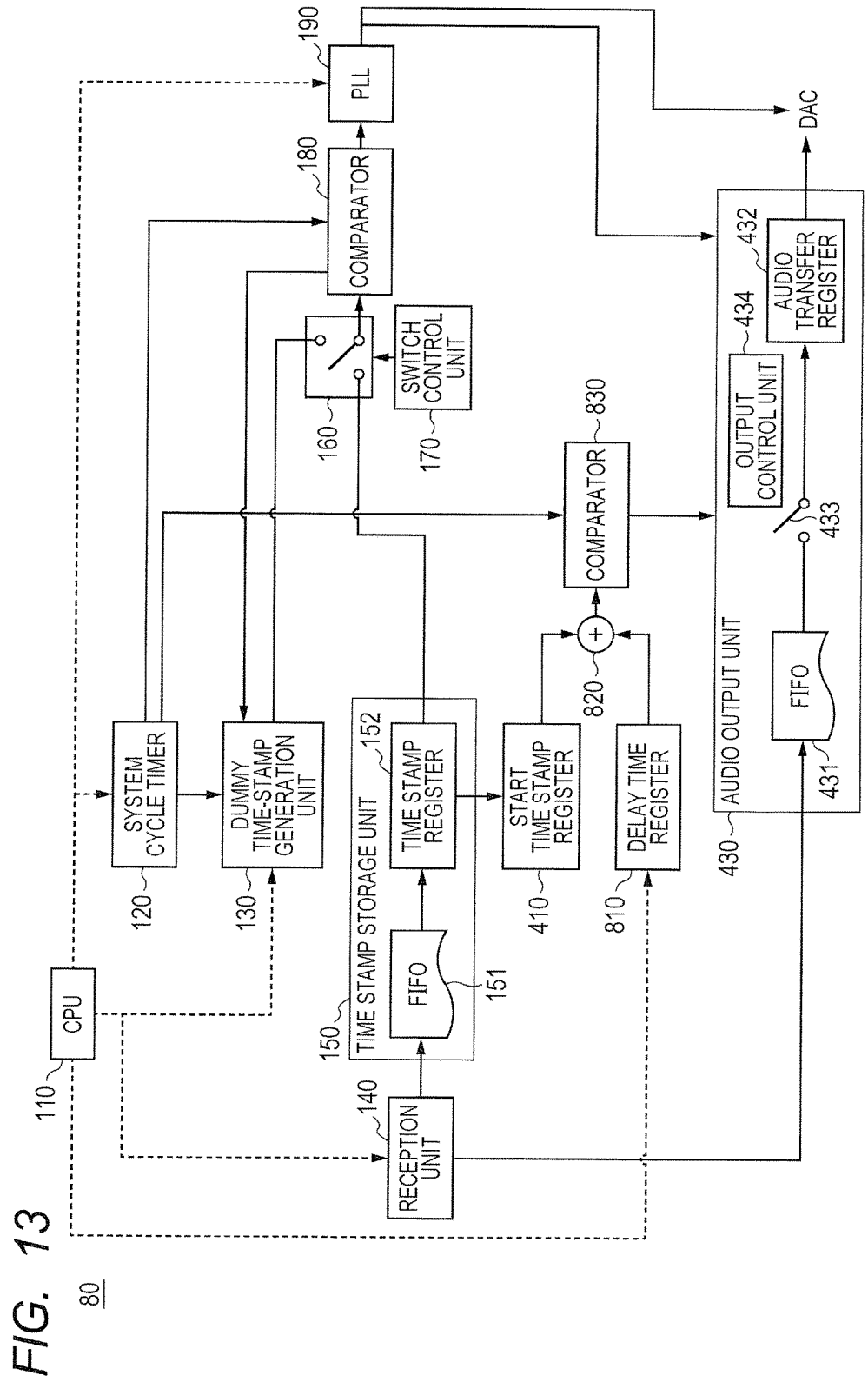
FIG. 13 is a block diagram illustrating a configuration example of a reception device according to an eighth embodiment.

FIG. 13 is a block diagram illustrating a configuration example of a reception device 80 according to an eighth embodiment. As illustrated in FIG. 13, the reception device 80 according to the eighth embodiment is different from the reception device 40 according to the fourth embodiment with respect to the points that a delay time register 810 and a computing unit 820 are added and the comparator 420 is replaced by a comparator 830. Hereinafter, the points different from the fourth embodiment will be described in detail and repetitive description will be properly omitted.

The delay time register 810 is a register holding predetermined delay time. The delay time set in the delay time register 810 is the same as that set in the delay control unit 711 in the seventh embodiment. In the eighth embodiment, the CPU 110 sets delay time in the delay time register 810 as an initial setting.

The computing unit 820 computes time which is changed so as to delay the time of the true time-stamp included in the packet received first by the reception device 80 only by the predetermined time. Concretely, the computing unit 820 is an adder adding time of the delay time register 810 to the time of the true time-stamp held by the start time stamp register 410 and outputting the computation result to the comparator 830.

The comparator 830 is a comparison circuit comparing the time of the true time-stamp changed by the computing unit 820 and the time indicated by the system cycle timer 120. When both of them match, the comparator 830 outputs a match signal to the audio output unit 430. Therefore, in the embodiment, the audio output unit 430 performs the control on the basis of the match signal output from the comparator 830.

As described above, in the reception device 80, by delaying the time stamp of an object to be compared in the comparator 830 only by predetermined delay time, the output timing of audio data to an external device is delayed only by the predetermined delay time. Consequently, also in the embodiment, the reproduction timings can be synchronized at the slowest reproduction timing. Therefore, in the case where a packet transmitted from a transmission device is received by a plurality of reception devices, fluctuations of audio data reproduction timings can be suppressed.

Although the configuration obtained by adding the configuration of delaying the output timing to the configuration of the reception device 40 according to the fourth embodiment is illustrated as the reception device 80 in the eighth embodiment, the reception device 80 may be configured by adding a similar configuration to the configuration of the reception device 50 according to the fifth embodiment. The reception device 80 may have a configuration of multiple channels as described in the sixth embodiment. In the eighth embodiment, as the configuration other than the audio output control, the configuration of any of the first to third embodiments may be employed.

Ninth Embodiment

Next, a ninth embodiment will be described. In the ninth embodiment, by further another configuration, the audio data reproduction timings are synchronized.

Figure 14:
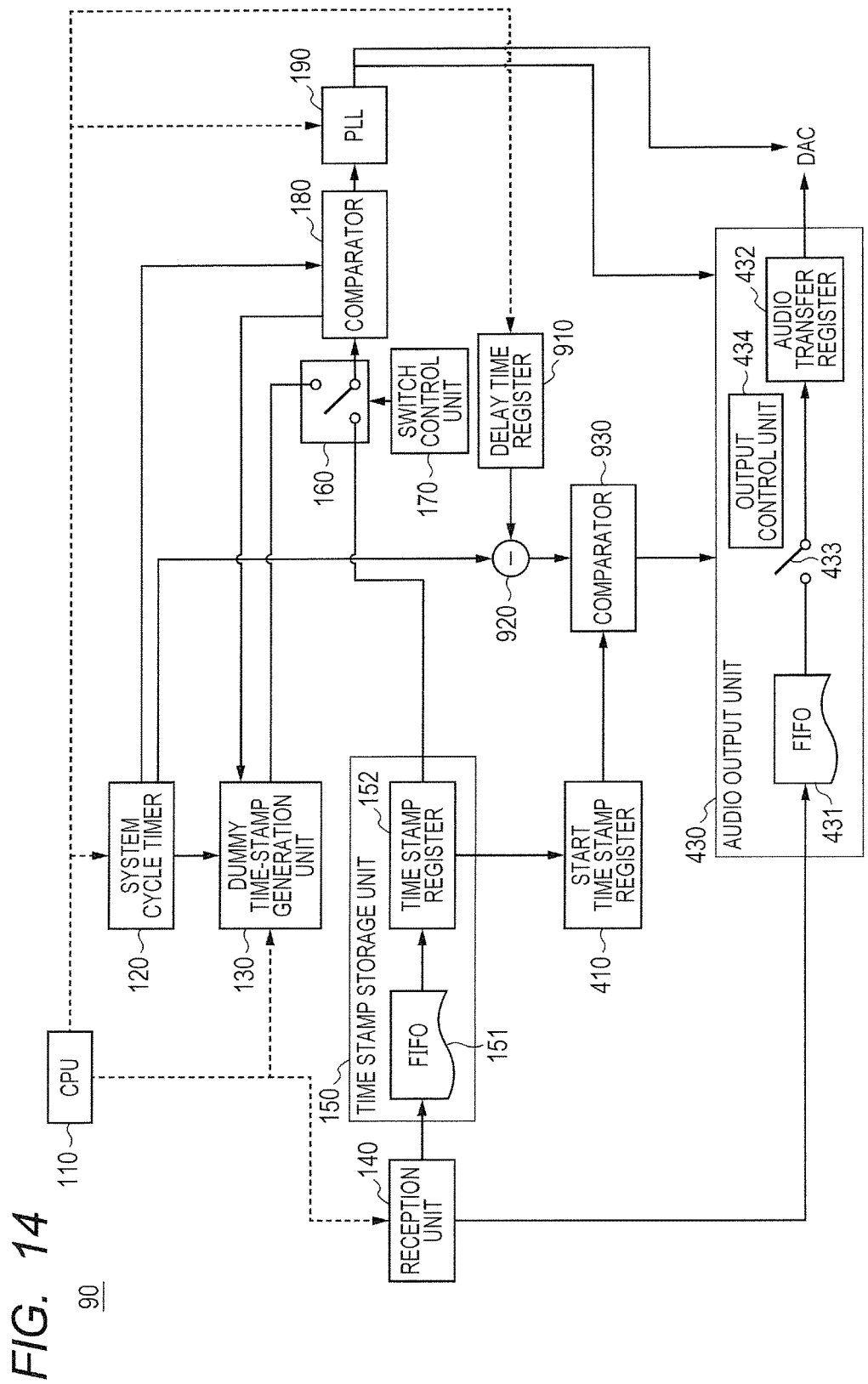
FIG. 14 is a block diagram illustrating a configuration example of a reception device according to a ninth embodiment.

FIG. 14 is a block diagram illustrating a configuration example of a reception device 90 according to a ninth embodiment. As illustrated in FIG. 14, the reception device 90 according to the ninth embodiment is different from the reception device 40 according to the fourth embodiment with respect to the points that a delay time register 910 and a computing unit 920 are added and the comparator 420 is replaced by a comparator 930. Hereinafter, the points different from the fourth embodiment will be described in detail and repetitive description will be properly omitted.

The delay time register 910 is a register holding predetermined delay time like the delay time register 810 according to the eighth embodiment. The delay time set in the delay time register 910 is the same as that set in the delay control unit 711 in the seventh embodiment. In the ninth embodiment, the CPU 110 sets delay time in the delay time register 910 as an initial setting.

The computing unit 920 computes time which is changed so as to advance the time indicated by the system cycle timer 120 only by the predetermined time. Concretely, the computing unit 920 is a subtractor subtracting time of the delay time register 910 from the time indicated by the system cycle timer 120 and outputting the computation result to the comparator 930.

The comparator 930 is a comparison circuit comparing the time of the true time-stamp included in the packet received first by the reception device 90 and the time computed by the computing unit 920. When both of them match, the comparator 930 outputs a match signal to the audio output unit 430. Therefore, in the embodiment, the audio output unit 430 performs the control on the basis of the match signal output from the comparator 930.

As described above, in the reception device 90, the time of the system cycle timer 120 is advanced only by predetermined delay time, and the resultant time is set as an object to be compared in the comparator 930. Consequently, the output timing to the external device of the audio data is delayed only by the predetermined delay time. Therefore, also in the embodiment, the reproduction timings can be set at the slowest reproduction timing. Therefore, in the case where a packet transmitted from a transmission device is received by a plurality of reception devices, fluctuations of audio data reproduction timings can be suppressed.

Although the configuration obtained by adding the configuration of delaying the output timing to the configuration of the reception device 40 according to the fourth embodiment is illustrated as the reception device 90 in the ninth embodiment, the reception device 90 may be configured by adding a similar configuration to the configuration of the reception device 50 according to the fifth embodiment. The reception device 90 may have a configuration of multiple channels as described in the sixth embodiment. In the ninth embodiment, as the configuration other than the audio output control, the configuration of any of the first to third embodiments may be employed.

Although the present invention achieved by the inventors herein has been concretely described above on the basis of the embodiments, obviously, the present invention is not limited to the foregoing embodiments but can be variously changed without departing from the gist.

What is claimed is:

1. A reception device comprising:
 a storage unit storing a true time-stamp included in a packet received including audio data and the true time-stamp expressing reproduction time of the audio data;
 a timer counting time;
 a dummy time-stamp generation unit generating a dummy time-stamp as a false time-stamp;
 a first comparator comparing time based on the true time-stamp stored in the storage unit or the dummy time-stamp and time indicated by the timer; and
 a clock generation unit generating a clock in accordance with a result of the comparison of the first comparator,
 wherein the first comparator performs a comparison using the dummy time-stamp until a predetermined condition is satisfied and, after the predetermined condition is satisfied, performs a comparison using the true time-stamp.

2. The reception device according to claim 1, further comprising a first computing unit computing a difference value between the time of the true time-stamp included in the packet received first and the time of the dummy time-stamp,
 wherein when performing the comparison using the true time-stamp, the first comparator compares time of the true time-stamp shifted only by the difference value computed by the first computing unit and the time indicated by the timer.

3. The reception device according to claim 1, further comprising:
 a first computing unit computing a difference value between the time of the true time-stamp included in the packet received first and the time of the dummy time-stamp; and
 a difference value subtraction unit decreasing an absolute value of the difference value computed by the first computing unit only by a predetermined value every comparison using the true time-stamp by the first comparator, wherein when performing the comparison using the true time-stamp, the first comparator compares time of the true time-stamp shifted only by the difference value computed by the difference value subtraction unit and the time indicated by the timer.

4. The reception device according to claim 1, wherein the clock generation unit supplies a generated clock to an external device including a digital-to-analog converter performing digital-to-analog conversion on the audio data.

5. The reception device according to claim 1, further comprising:

an audio output unit having a first buffer holding the audio data included in the packet received, an audio transfer register storing the audio data which is output to an external device including a digital-to-analog converter performing digital-to-analog conversion on the audio data, and a control unit controlling an input timing of the audio data from the first buffer to the audio transfer register; and a second comparator comparing time of the true time-stamp included in the packet received first and the time indicated by the timer, wherein the control unit controls so as to supply the audio data from the first buffer to the audio transfer register at a timing determined by the second comparator that the time indicated by the timer matches the time of the true time-stamp included in the packet received first.

6. The reception device according to claim 5, wherein the audio output unit further comprises a second buffer holding mute data, and wherein the control unit controls so as to supply the mute data from the second buffer to the audio transfer register until the time indicated by the timer matches the time of the true time-stamp included in the packet received first.

7. The reception device according to claim 5, further comprising a plurality of audio output units, wherein the control units of the audio output units control so as to supply the audio data from the first buffer to the audio transfer register at the same timing in accordance with a determination result of the second comparator.

8. The reception device according to claim 5, wherein the audio output unit further comprises a delay control unit delaying a timing of supplying the audio data from the first buffer to the audio transfer register.

9. The reception device according to claim 5, further comprising a second computing unit computing time changed so as to delay the time of the true time-stamp included in the packet received first only by predetermined time, wherein the second comparator compares the time of the true time-stamp changed by the second computing unit and the time indicated by the timer.

10. The reception device according to claim 5, further comprising a third computing unit computing time changed so as to advance the time indicated by the timer only by predetermined time, wherein the second comparator compares the time of the true time-stamp included in the packet received first and the time computed by the third computing unit.

11. A clock generating method comprising:

storing, in a storage, a true time-stamp included in a received packet, the packet including audio data and the true time-stamp expressing reproduction time of the audio data;

counting time by a timer;

generating, by at least one processor, a dummy time-stamp as a false time-stamp;

comparing, by the at least one processor, time based on the true time-stamp stored in the storage or the dummy time-stamp and time indicated by the timer;

generating, by the at least one processor, a clock in accordance with a result of the comparing operation;

wherein the comparing operation comprises:

performing a comparison using the dummy time-stamp until a predetermined condition is satisfied and, after the predetermined condition is satisfied, performing a comparison using the true time-stamp.

* * * * *